(12) United States Patent
Yabe et al.

(10) Patent No.: US 10,351,952 B2
(45) Date of Patent: *Jul. 16, 2019

(54) FILM FORMATION APPARATUS, FILM FORMATION METHOD, AND STORAGE MEDIUM

(71) Applicant: TOKYO ELECTRON LIMITED, Tokyo (JP)

(72) Inventors: Kazuo Yabe, Nirasaki (JP); Akira Shimizu, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 179 days.

This patent is subject to a terminal disclaimer.

(21) Appl. No.: 14/725,640

(22) Filed: May 29, 2015

(65) Prior Publication Data

US 2015/0354060 A1 Dec. 10, 2015

(30) Foreign Application Priority Data

Jun. 4, 2014 (JP) .................................. 2014-115851

(51) Int. Cl.
*C23C 16/44* (2006.01)
*H01L 21/67* (2006.01)
*C23C 16/455* (2006.01)
*C23C 16/40* (2006.01)

(52) U.S. Cl.
CPC ...... *C23C 16/45544* (2013.01); *C23C 16/401* (2013.01); *C23C 16/4412* (2013.01); *C23C 16/45534* (2013.01)

(58) Field of Classification Search
CPC ........ C23C 16/45597; C23C 16/45514–45517
See application file for complete search history.

(56) References Cited

U.S. PATENT DOCUMENTS

| 4,870,923 A | * | 10/1989 | Sugimoto | ............. C23C 16/455 118/715 |
|---|---|---|---|---|
| 5,024,716 A | | 6/1991 | Sato | |
| 6,017,827 A | | 1/2000 | Morgan et al. | |
| 6,413,583 B1 | | 7/2002 | Moghadam et al. | |

(Continued)

FOREIGN PATENT DOCUMENTS

| JP | 2007-251071 A | 9/2007 |
| JP | 2013-197421 A | 9/2013 |
| KR | 1020110031273 A | 3/2011 |

*Primary Examiner* — Charlee J C Bennett
(74) *Attorney, Agent, or Firm* — Nath, Goldberg & Meyer; Jerald L. Meyer

(57) ABSTRACT

A film formation apparatus of forming a thin film by stacking a molecular layer of an oxide on a surface of a substrate in a vacuum atmosphere formed within a vacuum chamber includes: a source gas supply unit supplying a source gas containing a source to the substrate; an atmosphere gas supply unit supplying an atmosphere gas to the vacuum chamber; an energy supply unit supplying energy to the ozone atmosphere; a control unit configured to output a control signal for repeatedly performing a cycle including a supply of the source gas, a supply of the atmosphere gas, and a supply of energy plural times; a buffer region connected to the vacuum chamber, an inert gas being supplied to the buffer region; and a partition unit partitioning the buffer region with respect to the vacuum chamber and making the buffer region communicate with the vacuum chamber.

5 Claims, 20 Drawing Sheets

(56) References Cited

U.S. PATENT DOCUMENTS

| | | |
|---|---|---|
| 7,422,636 B2 | 9/2008 | Ishizaka |
| 2001/0041250 A1 | 11/2001 | Werkhoven et al. |
| 2002/0009592 A1* | 1/2002 | Kitano .................. G03F 7/16 428/405 |
| 2002/0179248 A1 | 12/2002 | Kabansky |
| 2003/0207032 A1* | 11/2003 | Ahn .................. C23C 16/4412 427/255.34 |
| 2004/0002224 A1 | 1/2004 | Chono et al. |
| 2004/0050496 A1* | 3/2004 | Iwai .................. H01J 37/20 156/345.51 |
| 2004/0123803 A1 | 7/2004 | Strang |
| 2005/0178401 A1 | 8/2005 | Boyers |
| 2005/0249876 A1* | 11/2005 | Kawahara ......... C23C 16/45514 427/255.34 |
| 2005/0268856 A1* | 12/2005 | Miller ............... C23C 16/45519 118/729 |
| 2005/0287725 A1 | 12/2005 | Kitagawa |
| 2006/0088660 A1 | 4/2006 | Putkonen et al. |
| 2006/0107976 A1 | 5/2006 | Boyers et al. |
| 2006/0211243 A1 | 9/2006 | Ishizaka et al. |
| 2006/0213437 A1 | 9/2006 | Ishizaka et al. |
| 2006/0213439 A1 | 9/2006 | Ishizaka |
| 2006/0240677 A1 | 10/2006 | Horii et al. |
| 2006/0264066 A1 | 11/2006 | Bartholomew et al. |
| 2007/0010072 A1 | 1/2007 | Bailey et al. |
| 2007/0031598 A1 | 2/2007 | Okuyama et al. |
| 2007/0059896 A1 | 3/2007 | Yuan et al. |
| 2007/0065578 A1 | 3/2007 | McDougall |
| 2007/0116887 A1 | 5/2007 | Faguet |
| 2007/0116888 A1 | 5/2007 | Faguet |
| 2007/0237699 A1* | 10/2007 | Clark .................... C23C 16/308 423/263 |
| 2008/0286448 A1 | 11/2008 | Elam et al. |
| 2009/0126634 A1* | 5/2009 | Yamazawa .......... C23C 16/5096 118/723 R |
| 2009/0197411 A1 | 8/2009 | Dussarrat et al. |
| 2009/0203222 A1 | 8/2009 | Dussarrat et al. |
| 2009/0242957 A1 | 10/2009 | Ma et al. |
| 2009/0258144 A1 | 10/2009 | Gatineau et al. |
| 2009/0311879 A1 | 12/2009 | Blasco et al. |
| 2010/0243166 A1* | 9/2010 | Hayashi ........... H01J 37/32568 156/345.34 |
| 2011/0057562 A1 | 3/2011 | Chen et al. |
| 2011/0070380 A1 | 3/2011 | Shero et al. |
| 2011/0135842 A1* | 6/2011 | Faguet ............... C23C 16/4401 427/569 |
| 2011/0206846 A1 | 8/2011 | Elam et al. |
| 2011/0206909 A1 | 8/2011 | Sneh |
| 2011/0212625 A1 | 9/2011 | Toyoda et al. |
| 2011/0275166 A1 | 11/2011 | Shero et al. |
| 2011/0311725 A1 | 12/2011 | Sneh et al. |
| 2012/0098107 A1 | 4/2012 | Raisanen et al. |
| 2012/0161405 A1 | 6/2012 | Mohn et al. |
| 2012/0186521 A1* | 7/2012 | Iwasaki ............. C23C 16/45517 118/723 AN |
| 2013/0089667 A1 | 4/2013 | Lai et al. |
| 2016/0148801 A1* | 5/2016 | Yabe .................... C23C 16/402 438/778 |

* cited by examiner

FIG. 6 Step S4

FIG. 9
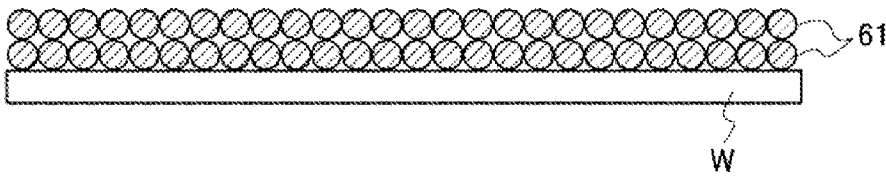
FIG. 10
Step S1
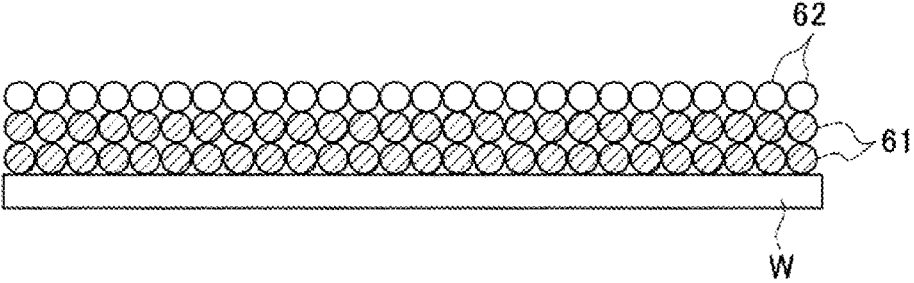
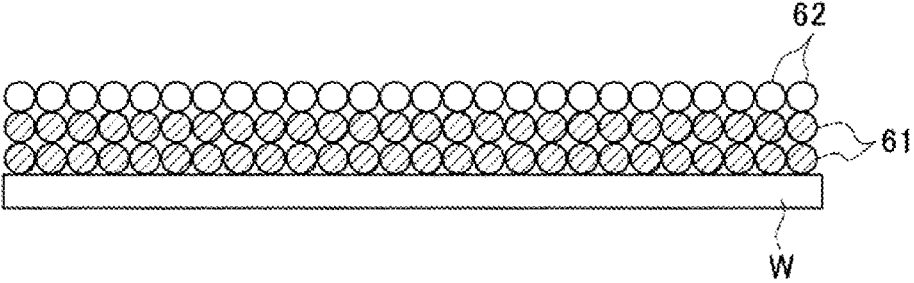

FILM FORMATION APPARATUS, FILM FORMATION METHOD, AND STORAGE MEDIUM

CROSS-REFERENCE TO RELATED APPLICATION

This application claims the benefit of Japanese Patent Application No. 2014-115851, filed on Jun. 4, 2014, in the Japan Patent Office, the disclosure of which is incorporated herein in its entirety by reference.

TECHNICAL FIELD

The present disclosure relates to a film formation apparatus and a method of forming an oxide film on a substrate in a vacuum atmosphere and a non-transitory computer-readable storage medium used in the film formation method and the film formation apparatus.

BACKGROUND

In a process of manufacturing semiconductor devices, a process of oxidizing a surface of a semiconductor wafer (hereinafter also referred to as a "wafer"), that is, a substrate, may be performed on the semiconductor wafer. There is known a technique for performing such oxidation.

For example, an atomic layer deposition (ALD) has been known as a process for performing oxidation. A process for forming a thin film, such as a silicon oxide ($SiO_2$) film, on a surface of a wafer using ALD may be performed. In a film formation apparatus for performing such ALD, a wafer mounting unit is installed in a processing chamber (vacuum chamber), where its inside has a vacuum atmosphere. Furthermore, a process of supplying the source gas including a silicon source on the loaded wafer and a process of oxidizing the source adsorbed on the wafer are alternately repeated plural times.

The process of oxidizing the source includes supplying an oxidizing gas, such as oxygen or ozone, to the wafer, and supplying hydrogen and oxygen to the wafer to thereby generate oxygen radicals, or generating oxygen plasma within the vacuum chamber. In this case, when supplying the oxidizing gas, the wafer needs to be heated at a relatively high temperature in order for the oxidizing gas to react with the source. Furthermore, when generating the oxygen radicals, the wafer needs to be heated at a relatively high temperature in order to generate the oxygen radicals. When generating the oxygen plasma, the components of the source gas accumulated on the wafer may be oxidized even at room temperature, but film qualities become different in a planar section from a lateral section of a pattern of the wafer due to the straightness of plasma activated species formed of ions or electrons. Thus, the film quality in the lateral section may be poorer than the film quality in the planar section. For this reason, it is difficult to apply such oxygen plasma to a micro pattern.

For this reason, a heating unit, such as a heater, is installed in a conventional film formation apparatus. However, if such a heating unit is installed as described above, the cost for manufacturing or operating the film formation apparatus is increased. Further, it is unable to oxidize the source until the wafer is heated up to a specific temperature after the wafer is carried into the vacuum chamber. Thus, it is difficult to reduce a processing period. There is known a technique in which the source is oxidized at room temperature. In contrast, in such a technique, a sudden pressure rise occurs within the processing chamber due to a chain decomposition reaction when the source is oxidized. Specifically, the pressure within the processing chamber is increased to a pressure that is 20 to 30 times the pressure prior to the reaction. Accordingly, it is difficult to apply the technique to an actual film formation apparatus. Furthermore, there is known a technique in which reactive species (atomic oxygen) are generated by supplying an oxygen gas, a nitrogen gas, and a hydrogen gas in a decompression atmosphere and mixing the gases. However, this technique is unable to solve the problem described above because the temperature in the atmosphere to which each gas is supplied becomes 400 degrees C. to 1200 degrees C. by the heater in order to generate the atomic oxygen.

SUMMARY

Some embodiments of the present disclosure provide a technique capable of obtaining an oxide film having good properties and preventing an excessive pressure rise within a processing chamber by sufficiently oxidizing a source without using a heating unit for heating a substrate in forming the oxide film on the substrate by repeating a cycle in which the source is adsorbed on the substrate and the source is oxidized.

According to one aspect of the present disclosure, a film formation apparatus of forming a thin film by stacking a molecular layer of an oxide on a surface of a substrate in a vacuum atmosphere formed within a vacuum chamber, includes: a source gas supply unit supplying a source gas containing a source to the substrate to adsorb the source on the substrate within the vacuum chamber; an atmosphere gas supply unit supplying an atmosphere gas to the vacuum chamber, the atmosphere gas forming an ozone atmosphere containing an ozone having a concentration equal to or higher than a concentration at which a chain decomposition reaction occurs within the vacuum chamber; an energy supply unit supplying an energy to the ozone atmosphere to generate activated species of an oxygen through a forced decomposition of the ozone, and to obtain the oxide by oxidizing the source adsorbed on the surface of the substrate through the activated species; a control unit configured to output a control signal for repeatedly performing a cycle including a supply of the source gas, a supply of the atmosphere gas, and a supply of the energy plural times; a buffer region connected to the vacuum chamber, an inert gas being supplied to the buffer region in order to reduce a pressure rise within the vacuum chamber attributable to the decomposition of the ozone; and a partition unit partitioning the buffer region with respect to the vacuum chamber when the atmosphere gas is supplied to the vacuum chamber, and making the buffer region communicate with the vacuum chamber when the ozone is decompressed.

According to another aspect of the present disclosure, a film formation method of forming a thin film by stacking a molecular layer of an oxide on a surface of a substrate in a vacuum atmosphere formed within a vacuum chamber, includes: performing a cycle repeatedly plural times, the cycle including: supplying a source gas containing a source to the vacuum chamber to adsorb the source on the substrate within the vacuum chamber; supplying an atmosphere gas to the vacuum chamber, the atmosphere gas forming an ozone atmosphere containing an ozone having a concentration equal to or higher than a concentration at which a chain decomposition reaction occurs; and supplying an energy to the ozone atmosphere to generate activated species of an oxygen through a forced decomposition of the ozone, and to obtain the oxide by oxidizing the source adsorbed on the surface of the substrate through the activated species; supplying an inert gas to a buffer region installed to reduce a pressure rise within the vacuum chamber attributable to the decomposition of the ozone; and making the buffer region, which is partitioned with respect to the vacuum chamber when the atmosphere gas is supplied to the vacuum chamber, communicate with the vacuum chamber when the ozone is decompressed.

According to another aspect of the present disclosure, a non-transitory computer-readable storage medium which stores a computer program used in a film formation apparatus forming a thin film by stacking a molecular layer of an oxide on a surface of a substrate in a vacuum atmosphere formed within a vacuum chamber, wherein the computer program includes steps organized so as to execute the film formation method as described above.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 9 is a schematic diagram illustrating the state of a wafer when the film formation process is performed.

FIG. 10 is a schematic diagram illustrating the state of the wafer when the film formation process is performed.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[First Embodiment]

Figure 1:
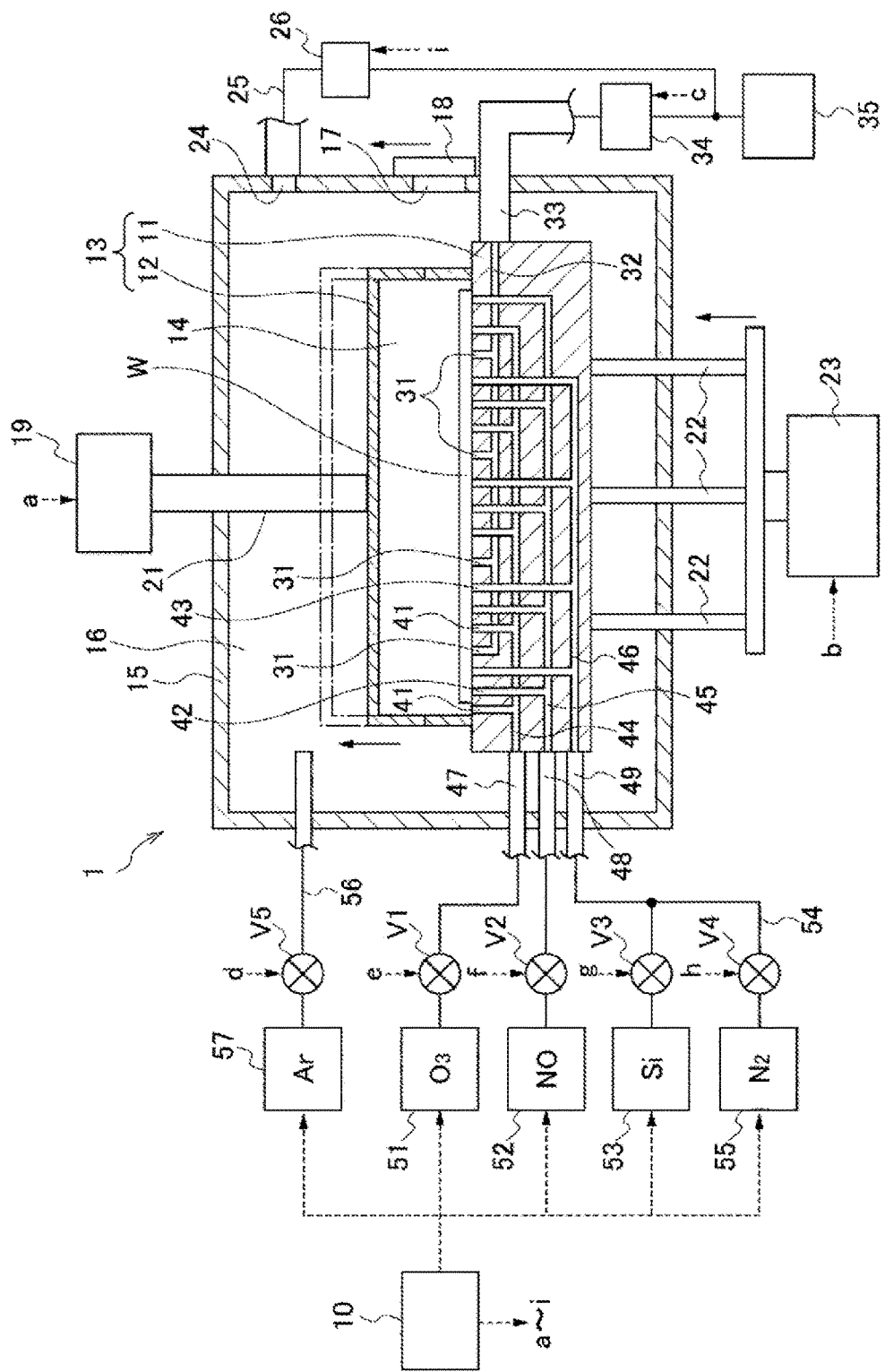
FIG. 1 is a vertical cross-sectional view showing a film formation apparatus in accordance with a first embodiment of the present disclosure.

A film formation apparatus 1 in accordance with a first embodiment of the present disclosure will be described with reference to a vertical cross-sectional side view of FIG. 1. The film formation apparatus 1 is configured to form a silicon oxide film on a wafer W, that is, a substrate, using an atomic layer deposition (ALD). In FIG. 1, reference numeral 11 denotes a circular stage, and the wafer W is horizontally loaded onto a surface of the stage 11. A cylindrical hood 12 having a cover is installed in the surface of the stage 11. The hood 12 can cover the entire wafer W on the stage 11. A vacuum chamber 13 is formed of the stage 11 and the hood 12. A processing space 14 formed within the vacuum chamber 13 becomes a vacuum atmosphere by exhausting an internal atmosphere during the processing of the wafer W. The processing space 14 is at room temperature when heating and cooling from an outside of the processing space 14 are not performed. Each subsequent reaction is performed at room temperature.

An outer chamber 15 is installed in the film formation apparatus 1 so as to surround the vacuum chamber 13. A space within the outer chamber 15 is formed of a buffer region 16. As will be described later, the buffer region 16 functions to reduce a pressure rise within the processing space 14. A conveyance opening 17 for the wafer W and a shutter 18 for opening and closing the conveyance opening 17 are installed on the sidewall of the outer chamber 15. In FIG. 1, reference numeral 19 denotes a hood lifting unit installed on the outside of the outer chamber 15. The hood lifting unit 19 is connected to the hood 12 by a lifting shaft 21, and moves the hood 12 up and down with respect to the stage 11, thus forming an opening/closing unit for opening and closing the vacuum chamber 13. In FIG. 1, a solid line indicates a location of the hood 12 when the wafer W is processed, and a chain line indicates the location of the hood 12 when the wafer W is carried in and out between the stage 11 and a conveyance unit (not shown). In FIG. 1, reference numeral 22 denotes a lifting pin. Bases of the lifting pins 22 are connected to a pin lifting unit 23 installed on the outside of the outer chamber 15. Front ends of the lifting pins 22 are protruded from the surface of the stage 11 by the pin lifting unit 23, and thus the wafer W is carried in and out between the stage 11 and the conveyance unit (not shown).

Figure 2:
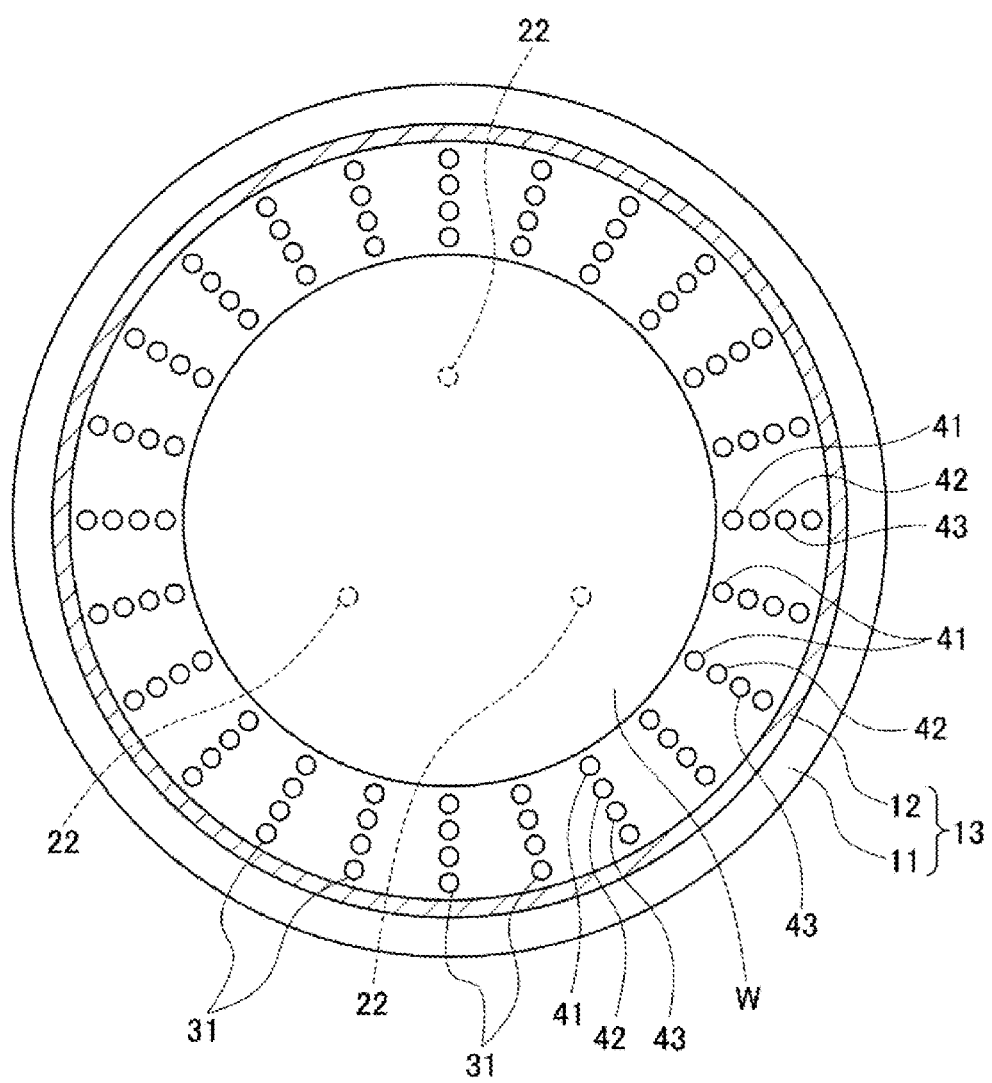
FIG. 2 is a plan view showing a stage of the film formation apparatus.
Figure 3:
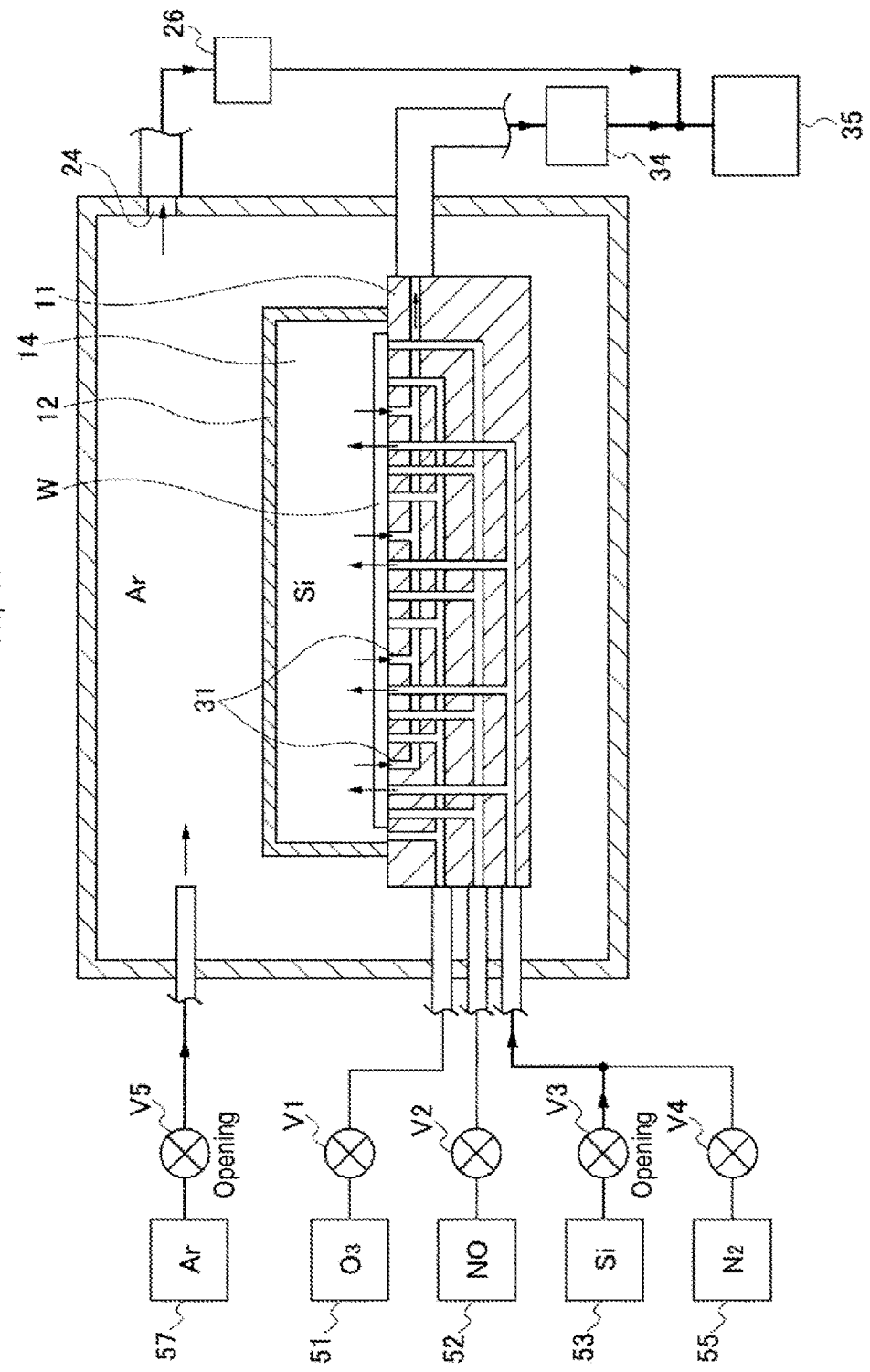
FIG. 3 is a process diagram illustrating a film formation process of the film formation apparatus.
Figure 4:
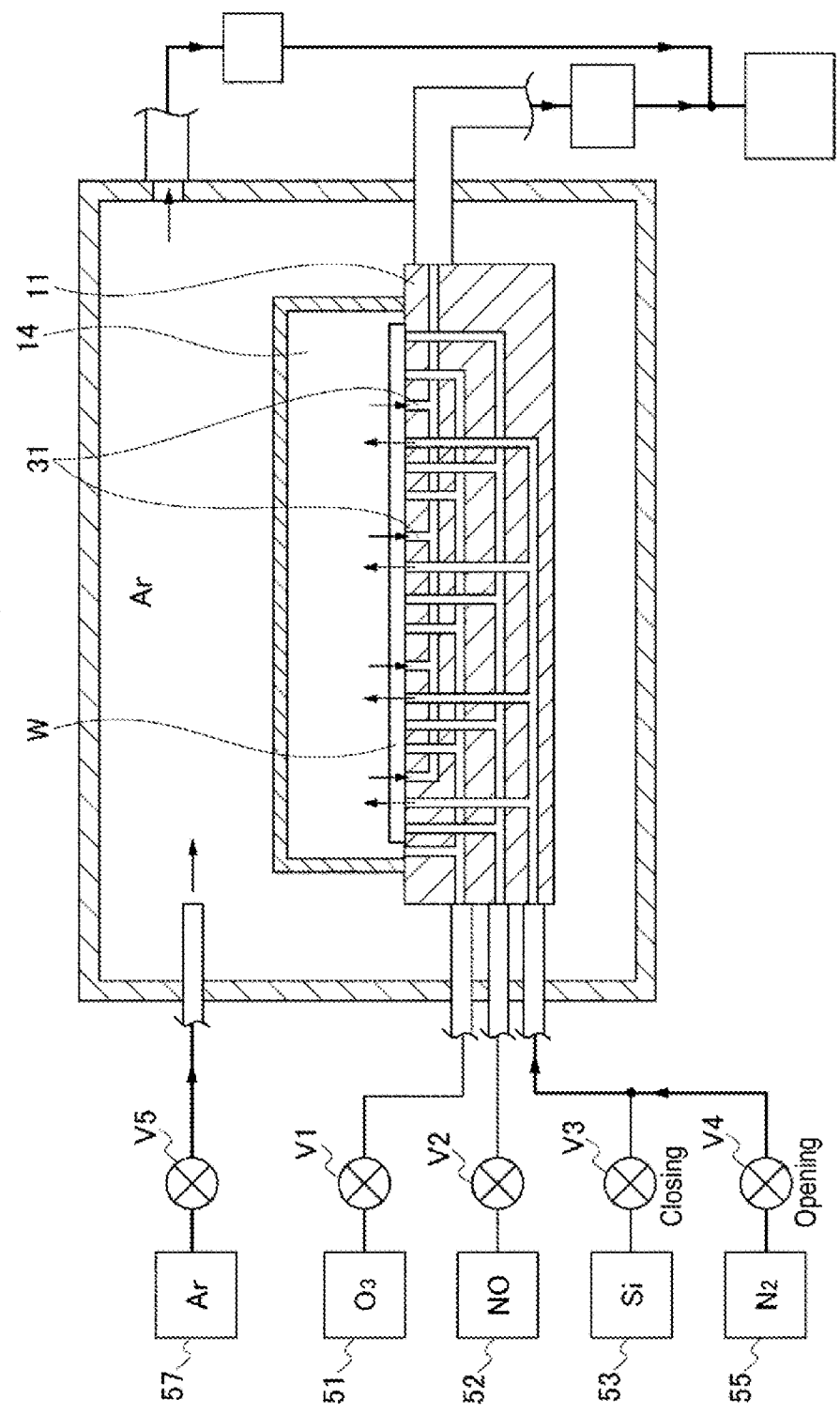
FIG. 4 is a process diagram illustrating the film formation process of the film formation apparatus.
Figure 5:
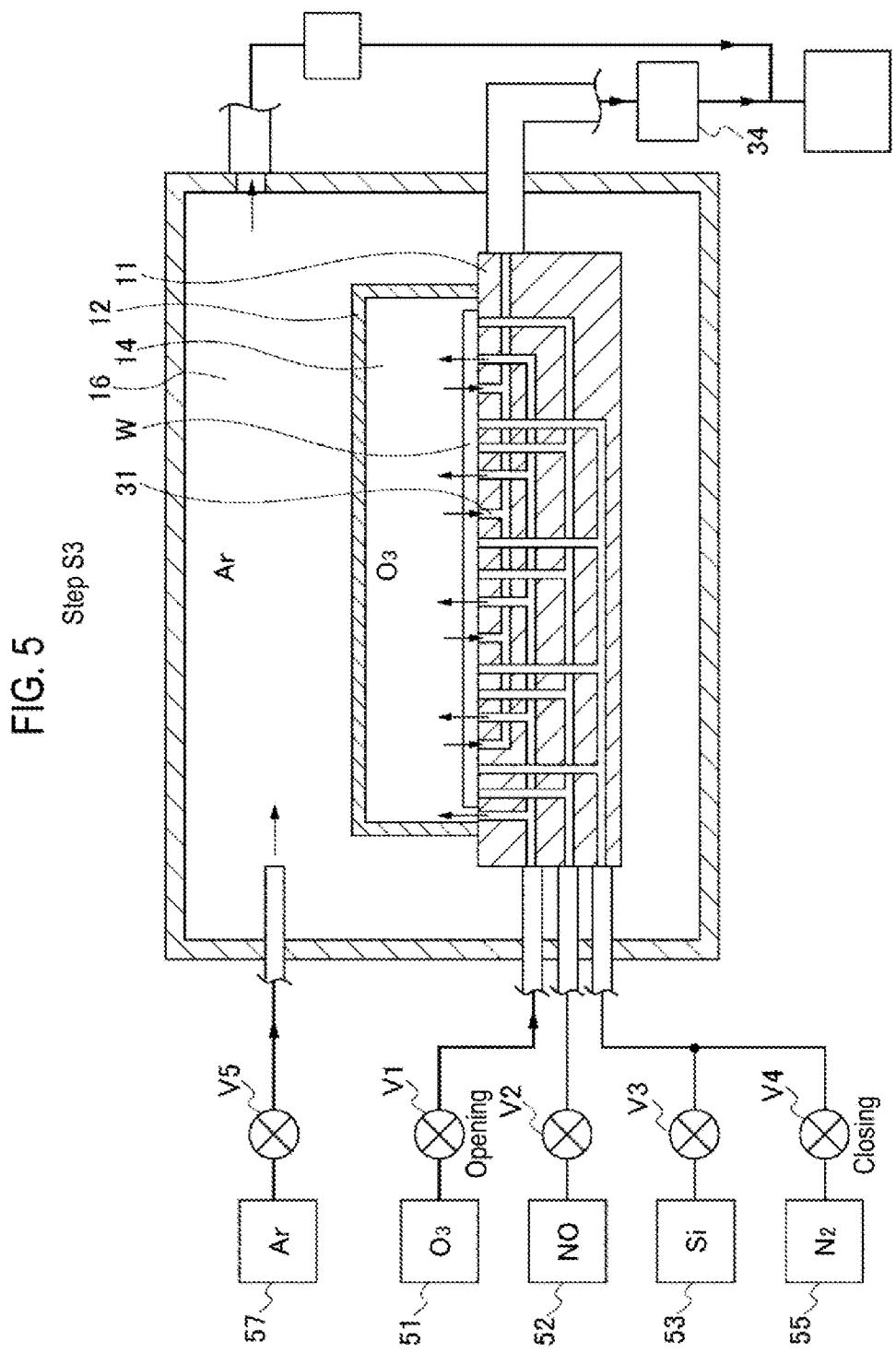
FIG. 5 is a process diagram illustrating the film formation process of the film formation apparatus.
Figure 6:
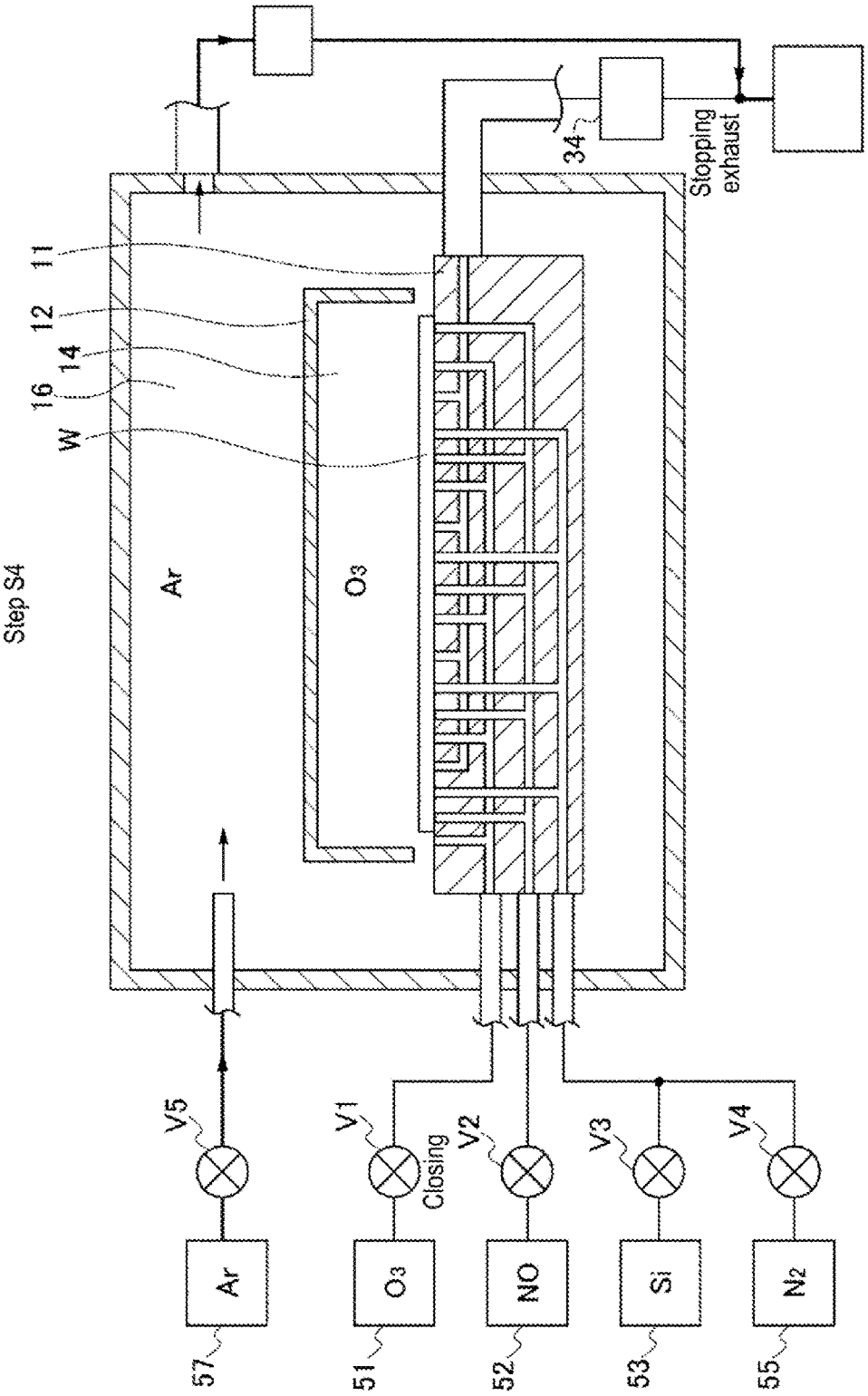
FIG. 6 is a process diagram illustrating the film formation process of the film formation apparatus.
Figure 7:
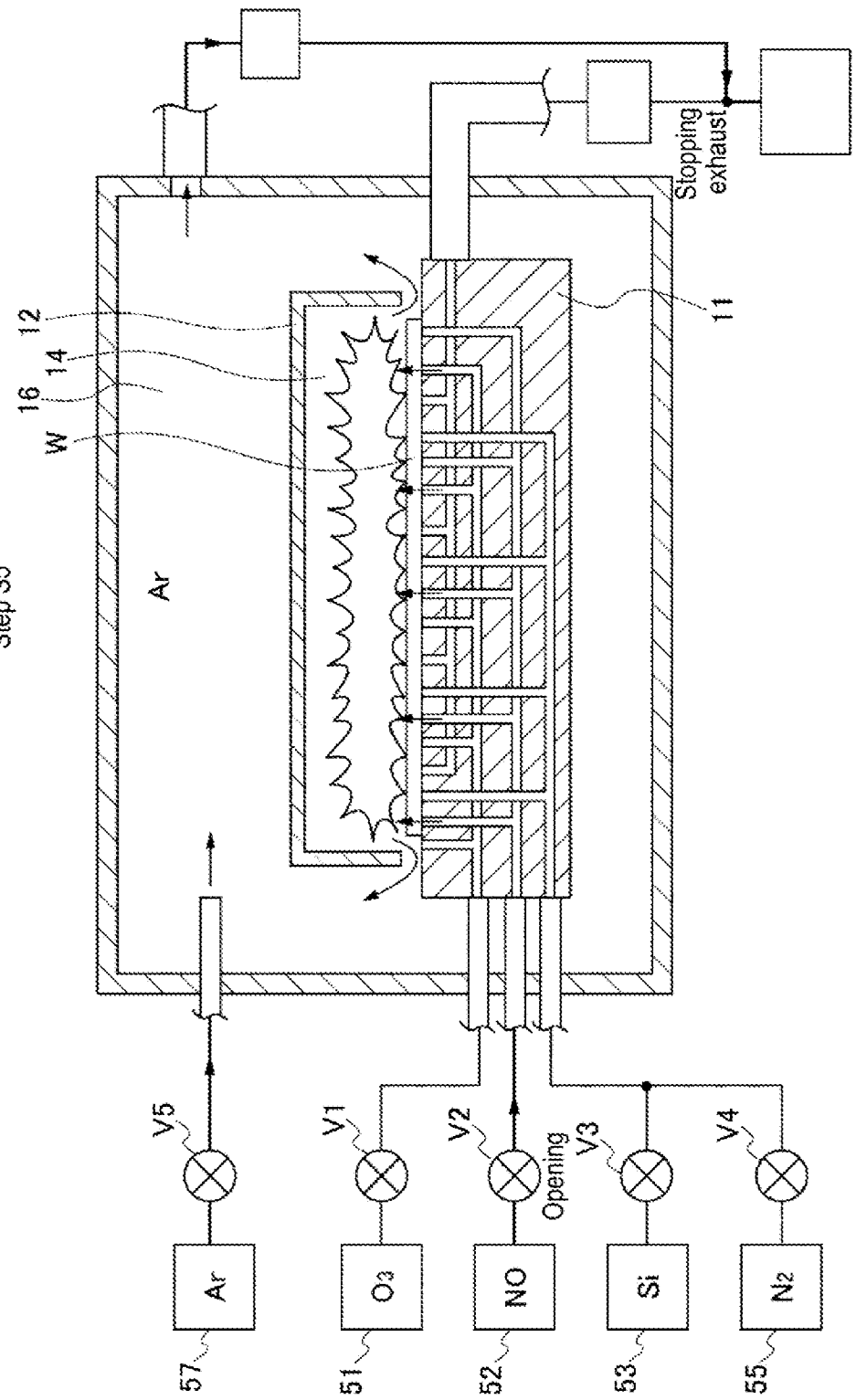
FIG. 7 is a process diagram illustrating the film formation process of the film formation apparatus.
Figure 8:
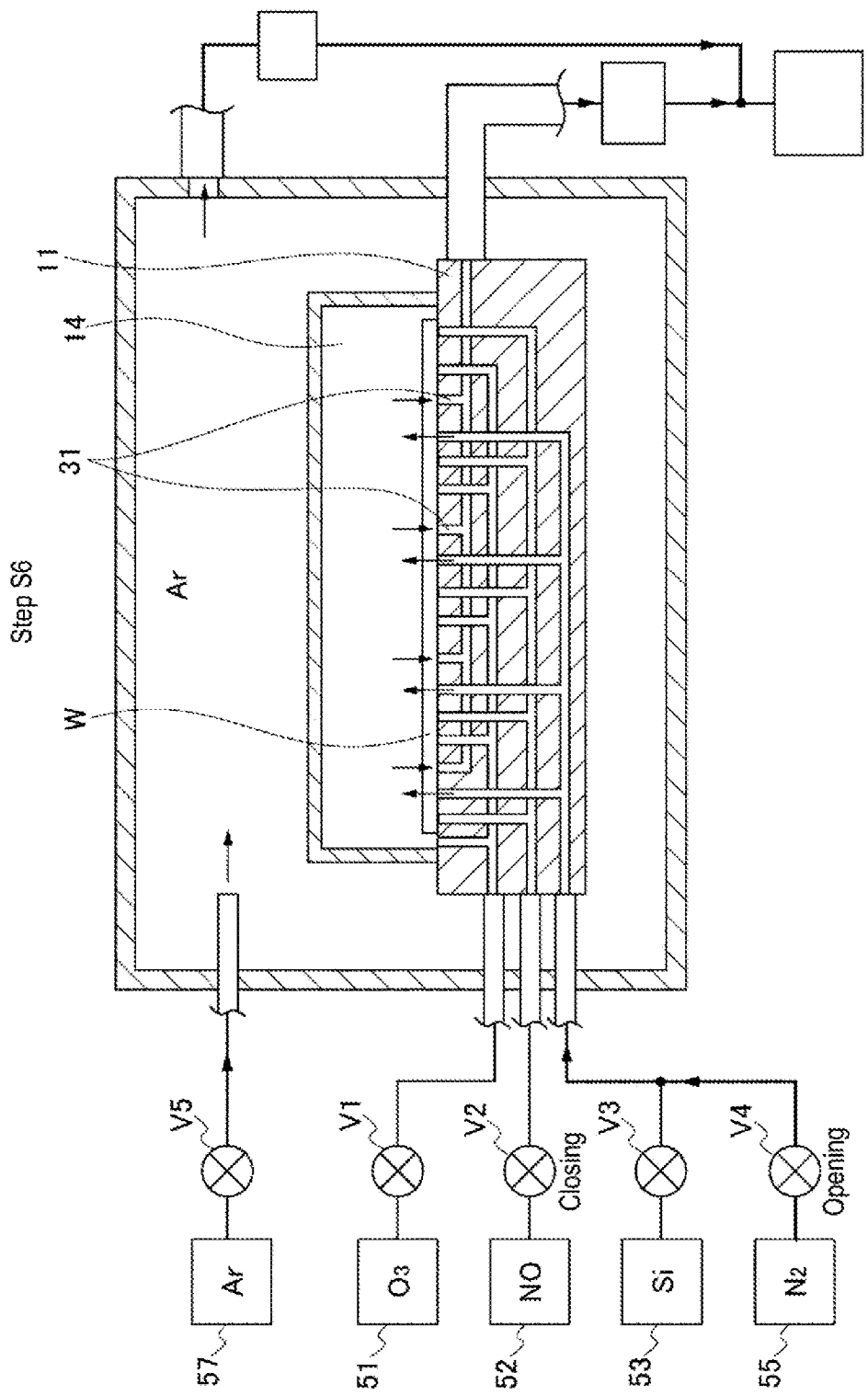
FIG. 8 is a process diagram illustrating the film formation process of the film formation apparatus.

FIG. 2 illustrates a surface of the stage 11, and the stage 11 is described with reference to FIG. 2. An exhaust port 31 configured to be open in the processing space 14 is formed in the surface of the stage 11. A plurality of the exhaust ports 31 is formed in a circumference direction of the stage 11, for example, and forms an upstream end of an exhaust passage 32 formed within the stage 11. One end of an exhaust pipe 33 is installed in the stage 11 so that the exhaust pipe 33 is connected to a downstream end of the exhaust passage 32. The other end of the exhaust pipe 33 is drawn to the outside of the outer chamber 15 and connected to an exhaust unit 35 through an exhaust amount adjustment unit 34. The exhaust unit 35 may be formed of a vacuum pump, for example. The exhaust amount adjustment unit 34 may include, for example, a valve, and make the processing space 14 have a vacuum atmosphere of required pressure by controlling an exhaust flow rate from the exhaust ports 31.

Furthermore, gas supply holes 41, 42, and 43 configured to be open in the processing space 14 are formed on the surface of the stage 11. The gas supply holes 41, 42, and 43 are formed within the stage 11, and form the respective downstream end of gas supply paths 44, 45, and 46 that are partitioned with respect to one another. One end of each of gas supply pipes 47, 48, and 49 is installed in the stage 11 so that the gas supply pipes 47, 48, and 49 are connected to the upstream ends of the gas supply paths 44, 45, and 46. The other end of each of the gas supply pipes 47, 48, and 49 is drawn to the outside of the outer chamber 15. The gas supply pipes 47, 48, and 49 are respectively connected to an ozone ($O_3$) gas supply source 51, a monoxide nitrogen (NO) gas supply source 52 that is an energy supply unit, and an aminosilane gas supply source 53 through respective valves V1, V2, and V3. The other end of the gas supply pipe 49 is branched from the downstream side of the valve V3, thus forming a gas supply pipe 54. The upstream end of the gas supply pipe 54 is connected to a nitrogen ($N_2$) gas supply source 55 through a valve V4.

Furthermore, one end of a gas supply pipe 56 is open in the buffer region 16 formed of the outer chamber 15. The other end of the gas supply pipe 56 is drawn to the outside of the outer chamber 15 and connected to an argon (Ar) gas supply source 57 through a valve V5. Furthermore, an exhaust port 24 is open in the buffer region 16. One end of an exhaust pipe 25 is connected to the exhaust port 24. The other end of the exhaust pipe 25 is connected between the exhaust amount adjustment unit 34 and the exhaust unit 35 in the exhaust pipe 33. An exhaust amount adjustment unit 26 configured similar to the exhaust amount adjustment unit 34 is installed in the exhaust pipe 25, thus being capable of adjusting an exhaust amount from the buffer region 16.

Each of the gas supply sources 51 to 53, 55, and 57 is configured to send each gas to the downstream side of the gas supply pipe in response to a control signal from a control unit 10 to be described later. The gas supply source 53, that is, a source gas supply unit, is additionally described below. A gas capable of forming a silicon oxide film through oxidation may be an aminosilane gas, that is, a film formation source supplied from the gas supply source 53. In this example, a bistertial butylaminosilane (BTBAS) gas is supplied from the gas supply source 53.

Furthermore, the $O_3$ gas supply source 51, that is, an atmosphere gas supply unit, is additionally described below. The $O_3$ gas supply source 51 is configured to supply an $O_3$ gas having a ratio of 8 to 100 Vol. % against oxygen, for example, to the gas supply pipe 47. As will be described in detail later, in the present embodiment, ozone is decomposed by supplying an NO gas to the processing space 14 into which the wafer W is carried in a state in which the processing space 14 becomes an ozone atmosphere. Such decomposition is a forced chain decomposition reaction. In the forced chain decomposition reaction, ozone is decomposed by NO, thereby generating activated species, such as oxygen radicals. Then, the surrounding ozone is decomposed by the activated species to thereby generate the activated species of oxygen. That is, when the NO gas is supplied to the processing space 14, in the pressure of the processing space 14, $O_3$ of a concentration equal to or higher than a concentration at which the chain decomposition reaction occurs needs to be present in the processing space 14. Accordingly, the $O_3$ gas from the $O_3$ gas supply source 51 is supplied to the processing space 14 so that such an atmosphere is formed in the processing space 14.

The film formation apparatus 1 includes the control unit 10. The control unit 10 may be a computer including a central processing unit (CPU) (not shown) and a memory unit, for example. The control unit 10 controls operations, such as opening/closing of each valve, adjusting of an exhaust flow rate by the exhaust amount adjustment units 26 and 34, supplying of a gas from each gas supply source to each gas supply pipe, moving of the lifting pins 22 up and down, and moving of the hood 12 up and down by sending a control signal to each unit of the film formation apparatus 1. Furthermore, a program, which is formed of a group of steps (or commands) in order to output such a control signal, is stored in the memory unit. The program may be stored in a storage medium, for example, a hard disk, a compact disk, a magnet optical disk, or a memory card and installed in the computer from the storage medium.

An operation of the film formation apparatus 1 is now described with reference to FIGS. 3 to 8. In FIGS. 3 to 8, a gas flow in the processing space 14 within the vacuum chamber 13 and the buffer region 16 in the outer chamber 15 is indicated by an arrow, and an opening/closing state of a corresponding valve is indicated by a letter indicative of opening or closing near the corresponding valve, if necessary. Furthermore, a pipe through which a gas flows is indicated by a thicker line than a pipe through which a gas does not flow. Furthermore, in FIGS. 3 to 8, some elements, such as the hood lifting unit 19, the lifting pins 22, and the conveyance opening 17 shown in FIG. 1, are not illustrated, for convenience of drawing.

As illustrated in FIG. 1 by a chain line, in a state in which the hood 12 forming the vacuum chamber 13 is moving up, the wafer W is carried over the stage 11 through the open conveyance opening 17 by the conveyance unit (not shown) and loaded onto the stage 11 by the lifting pins 22. After the conveyance unit retreats from the outer chamber 15, the hood 12 moving down and then a lower end of the hood 12 is closely attached to the surface of the stage 11. Thus, the processing space 14 is partitioned from the buffer region 16 and sealed. While the valve V5 is open and an Ar gas is supplied from the gas supply source 57 to the buffer region 16 within the outer chamber 15, a specific exhaust amount is exhausted through the exhaust ports 31 of the outer chamber 15 by the exhaust amount adjustment unit 26. Accordingly, a pressure within the buffer region 16 may become 50 Torr, for example.

While the pressure within the buffer region 16 is controlled as described above and the exhaust is performed through the exhaust ports 31 of the stage 11, the valve V3 is open and the aminosilane gas is supplied from the gas supply source 53 to the processing space 14. Accordingly, molecules of aminosilane, that is, the film formation source, are adsorbed on a surface of the wafer W, such that a molecular layer made of aminosilane (Step S1, FIG. 3) are formed. When the molecular layer is formed, the pressure of the processing space 14 may become 1 Torr (0.13×10³ Pa) to 10 Torr (1.3×10³ Pa), for example, so that particles are not generated from the aminosilane gas, but the adsorption is performed.

Thereafter, the valve V3 is closed, and the supply of the aminosilane gas to the processing space 14 is stopped. Next, the valve V4 is open and then an $N_2$ gas is supplied to the processing space 14. Surplus aminosilane which is not adsorbed on the wafer W within the processing space 14 is purged by the $N_2$ gas and removed from the exhaust ports 31 (Step S2, FIG. 4).

Subsequently, while the valve V4 is closed, the valve V1 is open and then an $O_3$ gas is supplied to the processing space 14. Thus, an ozone concentration within the processing space 14 rises (Step S3, FIG. 5). Thereafter, while the exhaust through the exhaust ports 31 is stopped by the exhaust amount adjustment unit 34, the valve V1 is closed and then the $O_3$ gas is sealed within the processing space 14. Accordingly, the pressure within the processing space 14 may become, for example, 50 Torr (6.5×10³ Pa) that is the same as the pressure within the buffer region 16 in the outside of the processing space 14. At this time, the ozone concentration within the processing space 14 becomes a concentration more than a critical value at which the chain decomposition reaction occurs when the NO gas is supplied to the processing space 14 in a subsequent step.

Thereafter, when the hood 12 slightly moves up, the processing space 14 communicates with the buffer region 16 through a gap formed between the lower end of the hood 12 and the surface of the stage 11. Although the hood 12 moves up as described above, the buffer region 16 and the processing space 14 have the same pressure. Therefore, both the introduction of the Ar gas from the buffer region 16 to the processing space 14 and the introduction of the $O_3$ gas from the processing space 14 to the buffer region 16 are suppressed. That is, although the gap is formed, the $O_3$ gas remains sealed within the processing space 14. As a result, a concentration of the $O_3$ gas within the processing space 14 maintains a concentration more than a critical value at which the chain decomposition reaction occurs (Step S4, FIG. 6).

Next, the valve V2 is open. The NO gas is supplied to the processing space 14, and comes in contact with ozone within the processing space 14. That is, the NO gas is ignited along with ozone, and thus the forced chain decomposition reaction (a combustion reaction) of ozone occurs as previously described. Accordingly, the activated species of oxygen react with the molecular layer of aminosilane adsorbed on the surface of the wafer W, thus oxidizing aminosilane. Accordingly, a molecular layer made of silicon oxide is formed. However, since the forced chain decomposition reaction of ozone is instantly performed, an amount of the activated species is suddenly increased within the processing space 14. That is, the gas is suddenly expanded within the processing space 14. However, since the processing space 14 and the buffer region 16 communicate with each other as described above, the expanded gas flows into the buffer region 16. Thus, it prevents the pressure within the processing space 14 from becoming excessive (Step S5, FIG. 7).

Since the activated species are unstable, once the activated species are generated, they are converted back to oxygen after, for example, several milliseconds, and thus the oxidation is terminated. The valve V2 is closed, the hood 12 moves down, and the processing space 14 is sealed again and partitioned from the buffer region 16. Furthermore, similar to Step S2, while the valve V4 is open and the $N_2$ gas is supplied to the processing space 14, and the exhaust is performed through the exhaust ports 31. Accordingly, oxygen is purged from the processing space 14. Furthermore, since the Ar gas is supplied and exhausted in the buffer region 16, oxygen generated from the activated species that have flown from the processing space 14 to the buffer region 16 in Step S5 is purged from the buffer region 16 (Step S6, FIG. 8). Thereafter, the operations of Steps S1 to S6 are repeated. That is, assuming that Steps S1 to S6 form a single cycle, the cycle is repeatedly performed several times. Furthermore, every time the cycle is performed, the molecular layer made of silicon oxide is stacked on the wafer W.

Figure 11:
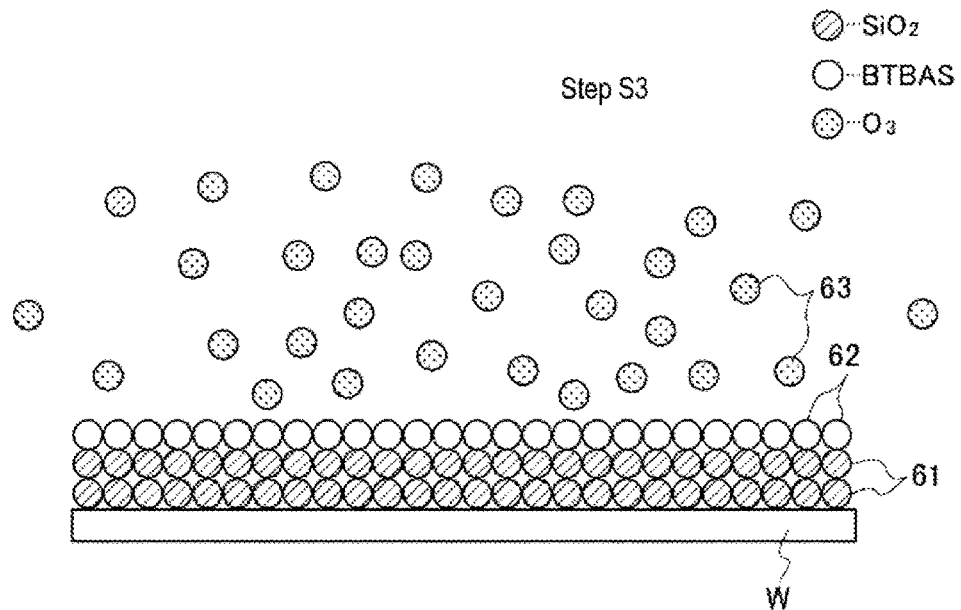
FIG. 11 is a schematic diagram illustrating the state of the wafer when the film formation process is performed.

A change of the state of the surface of the wafer W after a second cycle is performed is described with reference to schematic diagrams of FIGS. 9 to 14. FIG. 9 is a schematic diagram illustrating the state of a wafer before the cycle is started. FIG. 10 is a schematic diagram illustrating the state of the wafer in which the molecules 62 of aminosilane (BTBAS) are adsorbed on the surface of the wafer W after Step S1 of the cycle is performed. In FIGS. 9 to 14, reference numeral 61 denotes the molecules of silicon oxide already formed on the wafer W. FIG. 11 is a schematic diagram illustrating the state of the wafer in which the ozone gas is supplied to the processing space 14 in Step S3 of the same cycle. In FIG. 11, reference numeral 63 denotes the molecules of ozone.

Figure 12:
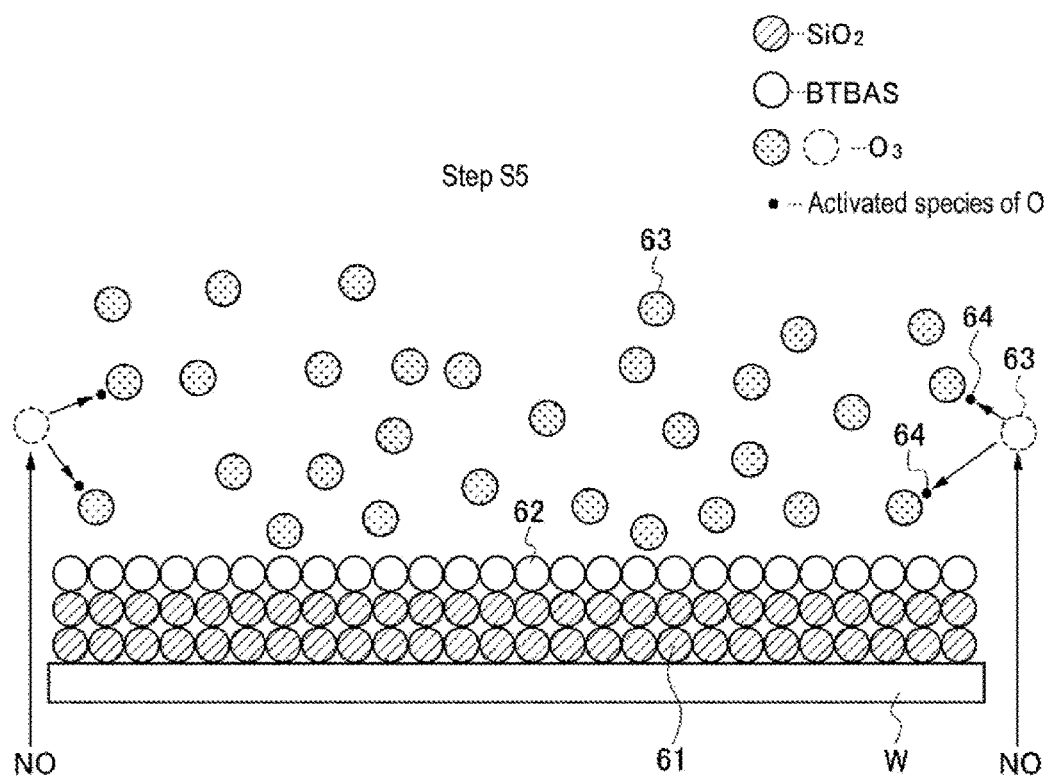
FIG. 12 is a schematic diagram illustrating the state of the wafer when the film formation process is performed.
Figure 13:
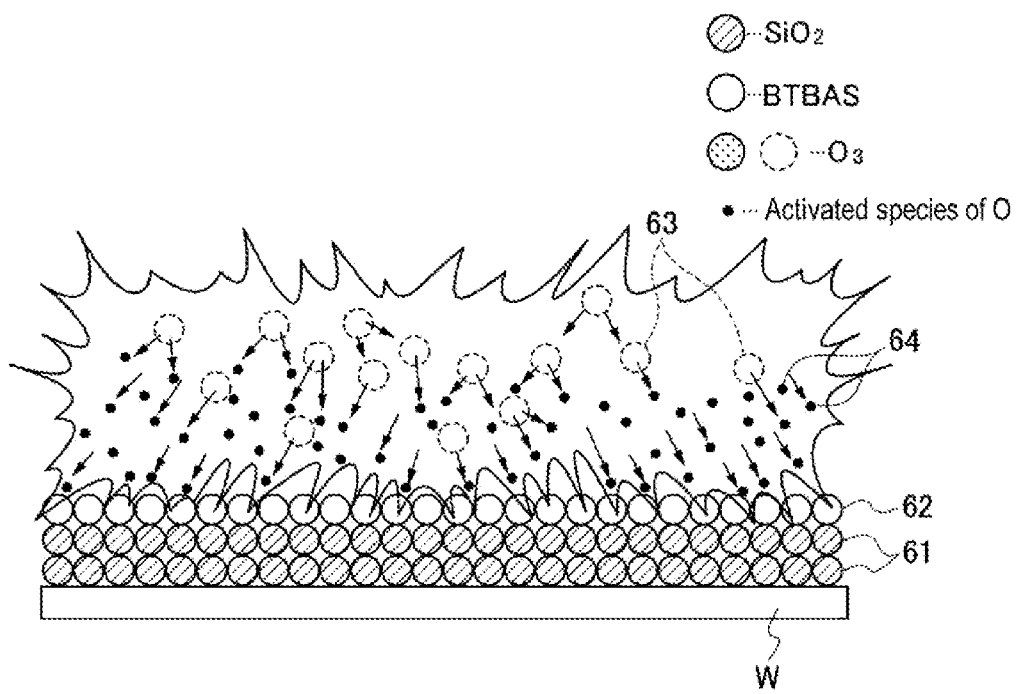
FIG. 13 is a schematic diagram illustrating the state of the wafer when the film formation process is performed.

FIG. 12 illustrates a moment at which the NO gas is supplied to the processing space 14 in Step S5. As described above, when NO reacts chemically with ozone, energy is applied to ozone. Then, ozone is forcibly decomposed, so that the activated species 64 of oxygen are generated. Furthermore, ozone is forcibly decomposed by the activated species 64, and ozone is further decomposed by the generated activated species 64. Ozone is subject to chain decomposition as described above, and ozone within the processing space 14 is instantly converted into the activated species 64 (see FIG. 13).

Figure 14:
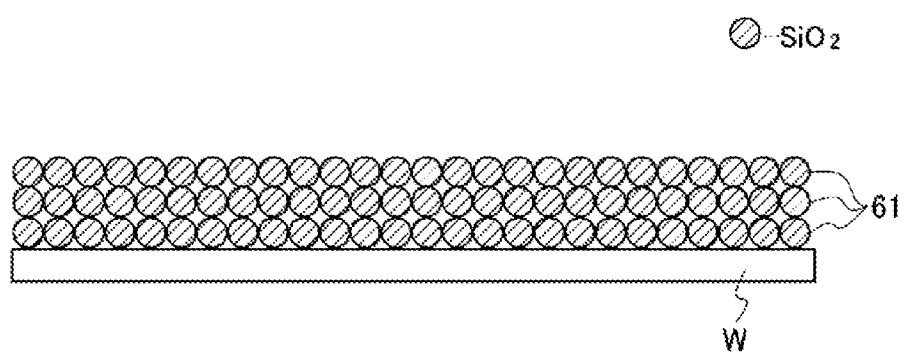
FIG. 14 is a schematic diagram illustrating the state of the wafer when the film formation process is performed.

Furthermore, heat and light energy emitted from the chain decomposition reaction of ozone are applied to the molecules 62 of aminosilane exposed on a space in which the corresponding chain decomposition reaction occurs. As a result, energy of the molecules 62 instantly increases, and thus a temperature of the molecules 62 rises. Furthermore, the activated species 64 capable of reacting with the molecules 62 of the activated aminosilane are present around the molecules 62 of aminosilane activated because the temperature of aminosilane rises as described above. Therefore, the molecules 62 of aminosilane react with the activated species 64 of oxygen. That is, the molecules 62 of aminosilane are oxidized, and thus the molecules 61 of silicon oxide are generated (FIG. 14).

Energy generated by the chain decomposition reaction of ozone as described above is applied to the molecules of aminosilane. Thus, aminosilane can be oxidized although the wafer W is not heated using a heater as described in the background. In Steps S1 to S6 of the cycle subsequent to the second cycle, the molecules 62 of aminosilane have been illustrated as being oxidized. Likewise, as in Steps S1 to S6 of the first cycle, energy generated by the decomposition of ozone is applied to the molecules 62 of aminosilane, and thus the molecules 62 are oxidized. If the silicon oxide film having a required film thickness is formed after the cycle is repeatedly performed a specific number of times, the wafer W is carried out from the vacuum chamber 13 and the outer chamber 15.

In accordance with the film formation apparatus 1, as previously described, an ozone atmosphere of a relatively high concentration is formed within the vacuum chamber 13, ozone is subject to chain decomposition by the NO gas at room temperature, aminosilane on the surface of the wafer W is oxidized by the activated species generated by the chain decomposition, thereby forming the oxide film. As will be illustrated in an evaluation test to be described later, the oxide film formed as described above has the same film quality as an oxide film formed by heating the wafer W. Accordingly, a manufacturing cost and an operation cost for the film formation apparatus 1 can be reduced because a heater for heating the wafer W in order to oxidize does not need to be installed in the film formation apparatus 1. Furthermore, aminosilane can be oxidized without waiting for the time during which the wafer W is heated to a specific temperature using a heater. Accordingly, the time required for performing the film formation process can be reduced, and the throughput can be improved. Furthermore, when the chain decomposition reaction is performed in a state in which the $O_3$ gas is sealed in the processing space 14 having a relatively small volume, the processing space 14 communicates with the buffer region 16 to which an inert gas is supplied. Therefore, a region in which the chain decomposition reaction occurs is limited to the processing space 14. That is, a pressure rise within the processing space 14 can be reduced by sending a suddenly expanded gas within the processing space 14 to the buffer region 16. Accordingly, the damage or deterioration of the wafer W attributable to the pressure rise can be suppressed. Furthermore, similar to the wafer W, the damage or deterioration of the vacuum chamber 13 can be suppressed. In other words, since the pressure resistance of the vacuum chamber 13 does not need to be increased, the configuration of the vacuum chamber 13 can be simplified and a rise of the manufacture cost can be suppressed.

Furthermore, when the aminosilane gas is supplied to the wafer W, the processing space 14 is partitioned from the buffer region 16. That is, since the processing space 14 is limited to a small volume, a reduction in the concentration of the aminosilane gas supplied to the processing space 14 can be suppressed. In other words, in adsorbing aminosilane on the wafer W, since the aminosilane gas does not need to have a high concentration, a rise of the operation cost of the film formation apparatus can be suppressed.

In the processing example, when the hood 12 moves up in Step S4, the processing space 14 and the buffer region 16 are made to have the same pressure, so that a gas flow formed between the processing space 14 and the buffer region 16 is suppressed. When the NO gas is supplied in Step S5, a concentration of the $O_3$ gas within the processing space 14 is made to have a concentration at which the chain decomposition reaction can occur more certainly. In this case, if the concentration of ozone within the processing space 14 maintains the concentration at which the chain decomposition reaction can occur while the NO gas is supplied, the gas flow may be formed between the processing space 14 and the buffer region 16. That is, when the hood 12 moves up, the processing space 14 and the buffer region 16 may have different pressure.

In the processing example, in order to form an atmosphere in which the chain decomposition reaction occurs, the pressure within the processing space 14 in Steps S3 and S4 has been illustrated as being set to 50 Torr, but the pressure is not limited to 50 Torr. For example, if the chain decomposition reaction can occur, the pressure within the processing space 14 may be set to 20 Torr to 30 Torr. As the pressure within the processing space 14 in Steps S3 and S4 becomes higher, the concentration of ozone within the processing space 14 required to generate the chain decomposition reaction becomes lower. However, as the pressure within the processing space 14 in Steps S3 and S4 becomes higher, the pressure within the processing space 14 and the buffer region 16 becomes higher during the chain decomposition reaction. Even when the chain decomposition reaction is performed, the processing space 14 and the buffer region 16 are made to maintain an atmosphere lower than the atmospheric pressure, that is, the vacuum atmosphere. Therefore, the pressure within the processing space 14 in Steps S3 and S4 is set so that the vacuum chamber 13, the outer chamber 15, and the wafer W are not damaged.

In some embodiments, a spring may be installed between a ceiling of the outer chamber 15 and an upper portion of the hood 12 instead of closely attaching the hood 12 to the stage 11 using the hood lifting unit 19, that is, a partition unit. The hood 12 may be closely attached to the stage 11 by a biasing force of the spring. More specifically, in Steps S1 to S3 and S6, the hood 12 is biased against the stage 11 by the spring, and thus the processing space 14 is partitioned from the buffer region 16. Furthermore, in Step S5, if the pressure within the processing space 14 rises due to the chain decomposition reaction, the hood 12 resists against the biasing force of the spring due to the pressure rise to thereby float from the state 11, so that the processing space 14 communicates with the buffer region 16. In such a configuration, the pressure rise within the processing space 14 can be reduced because a gas within the processing space 14 is diffused into the buffer region 16 during the chain decomposition reaction.

Furthermore, in the film formation apparatus 1, the processing space 14 communicates with or is partitioned from the buffer region 16 by moving the hood 12 up and down with respect to the stage 11. In another embodiment, the processing space 14 may communicate with or be partitioned from the buffer region 16 by moving the stage 11 up and down with respect to the hood 12. Furthermore, each gas may be supplied from the hood 12 to the processing space 14 instead of supplying the gas from the stage 11 to the processing space 14. In this case, the NO gas may be introduced from the ceiling of the hood 12 to the processing space 14 so that the chain decomposition reaction occurs downward, and the wafer W may be closely attached to the stage 11 so as to prevent a positional deviation of the wafer W.

In the processing example, the supply of the Ar gas to the buffer region 16 and the exhaust of the buffer region 16 have been illustrated as being performed during the steps of the single cycle. By the supply of the Ar gas and the exhaust of the buffer region 16, the ozone gas is sealed within the processing space 14 when the processing space 14 communicates with the buffer region 16, the pressure rise within the processing space 14 is prevented during the decomposition reaction, and reaction products of the buffer region 16 are purged. Accordingly, for example, in Steps S1 and S2, the Ar gas may not be supplied and the buffer region 16 may not be exhausted.

In Steps S4 and S5, that is, when the processing space 14 communicates with the buffer region 16 and when the chain decomposition reaction occurs, the supply of the Ar gas to the buffer region 16 and the exhaust of the buffer region 16 may not be performed, and the Ar gas may be sealed within the buffer region 16. Furthermore, in the processing example, the Ar gas, that is, an inert gas, has been illustrated as being supplied to the buffer region 16, and the $N_2$ gas, that is, an inert gas, has been illustrated as being supplied to the processing space 14. In some embodiments, the $N_2$ gas may be supplied to the buffer region 16, and the Ar gas may be supplied to the processing space 14. In another embodiment, inert gases other than the Ar gas and the $N_2$ gas may be used.

[Second Embodiment]

Figure 15:
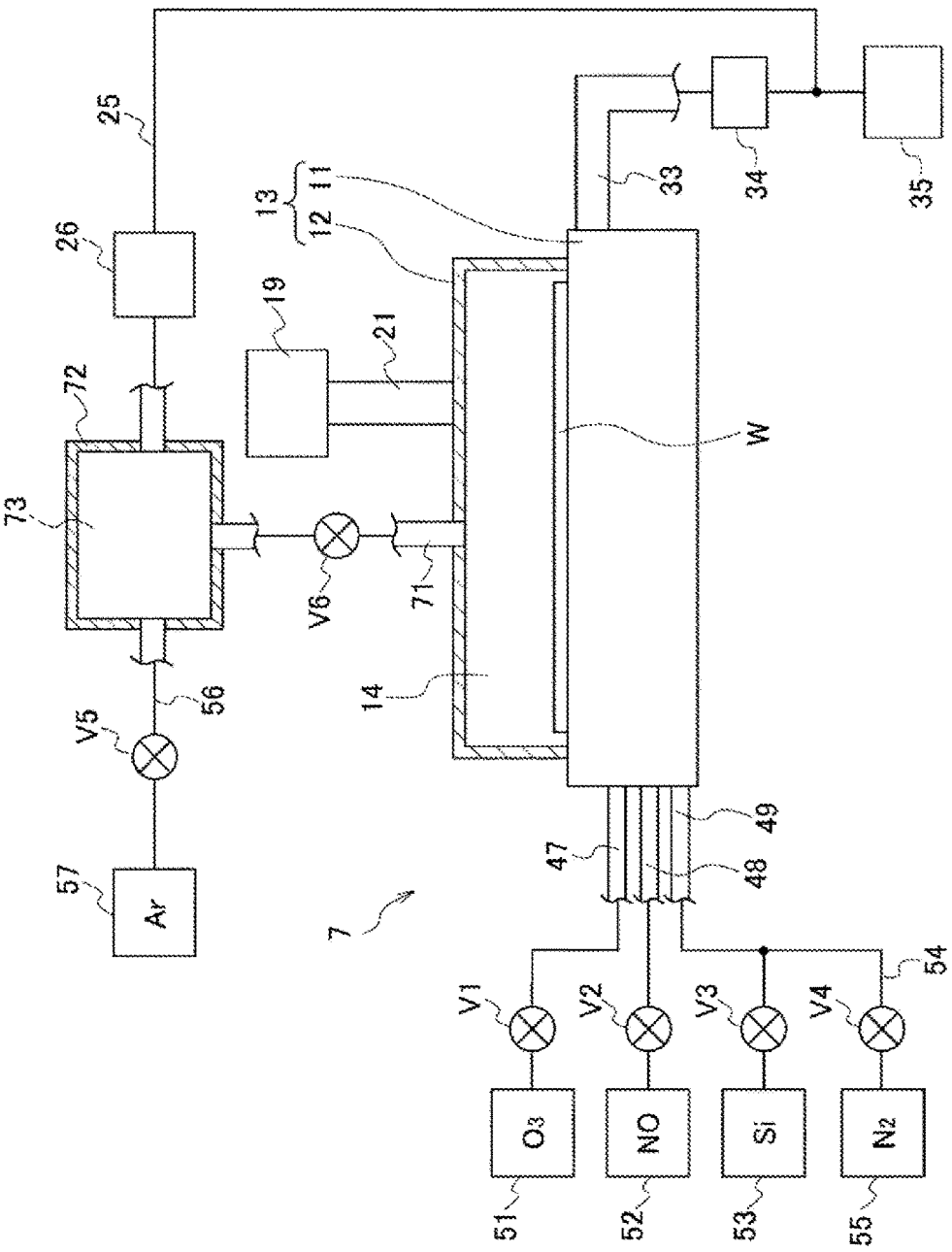
FIG. 15 is a vertical cross-sectional view showing a film formation apparatus in accordance with a second embodiment of the present disclosure.

A film formation apparatus 7 in accordance with a second embodiment of the present disclosure is described below with reference to FIG. 15 based on a difference between the film formation apparatus 7 and the film formation apparatus 1. In the film formation apparatus 7, the outer chamber 15 is not installed and instead, an exhaust pipe 71 and a buffer tank 72 are installed. One end of the exhaust pipe 71 is open within the hood 12, and the other end of the exhaust pipe 71 is open in a buffer region 73 within the buffer tank 72. That is, the processing space 14 and the buffer region 73 are connected to each other through the exhaust pipe 71. A valve V6 forming a partition unit is installed in the exhaust pipe 71.

Furthermore, a downstream end of the gas supply pipe 56 connected to the Ar gas supply source 57 is not open within the outer chamber 15, but is open within the buffer region 73. An upstream end of the exhaust pipe 25 which is open in the outer chamber 15 in the first embodiment is open in the buffer region 73. Furthermore, in FIG. 15, each of the passages or the lifting pins 22 formed in the stage 11 is not illustrated.

An operation of the film formation apparatus 7 is described below. In a state in which the wafer W is loaded onto the stage 11 and the valve V6 is closed, the exhaust of the processing space 14 and the supply of the BTBAS gas to the processing space 14 are performed, similar to Step S1 of the first embodiment. Meanwhile, the valve V5 is open. The Ar gas is supplied to the buffer region 73 while the exhaust of the buffer region 73 is performed. Accordingly, a pressure within the buffer region 73 may become 50 Torr, for example (Step S11).

Figure 16:
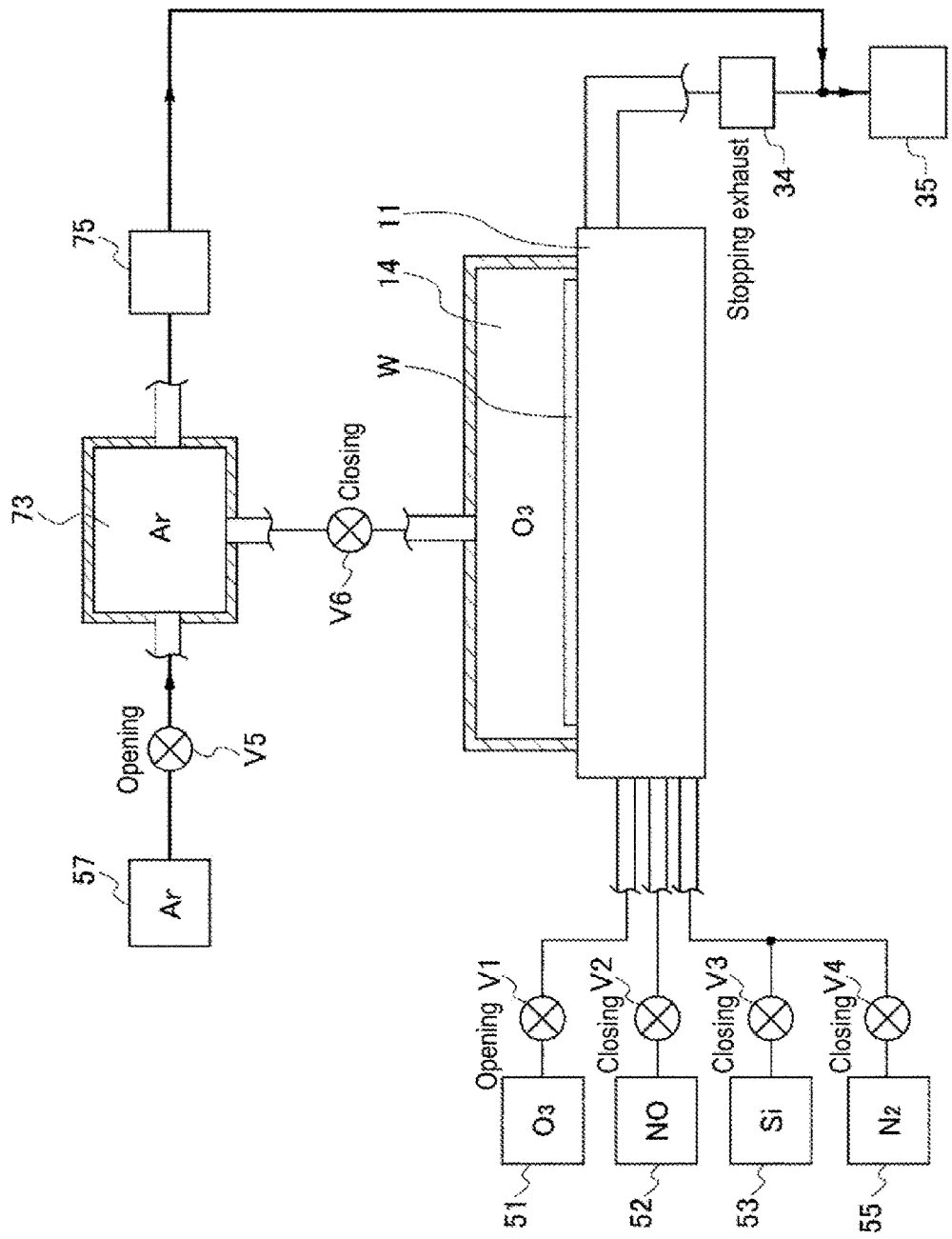
FIG. 16 is a process diagram illustrating a film formation process of the film formation apparatus.
Figure 17:
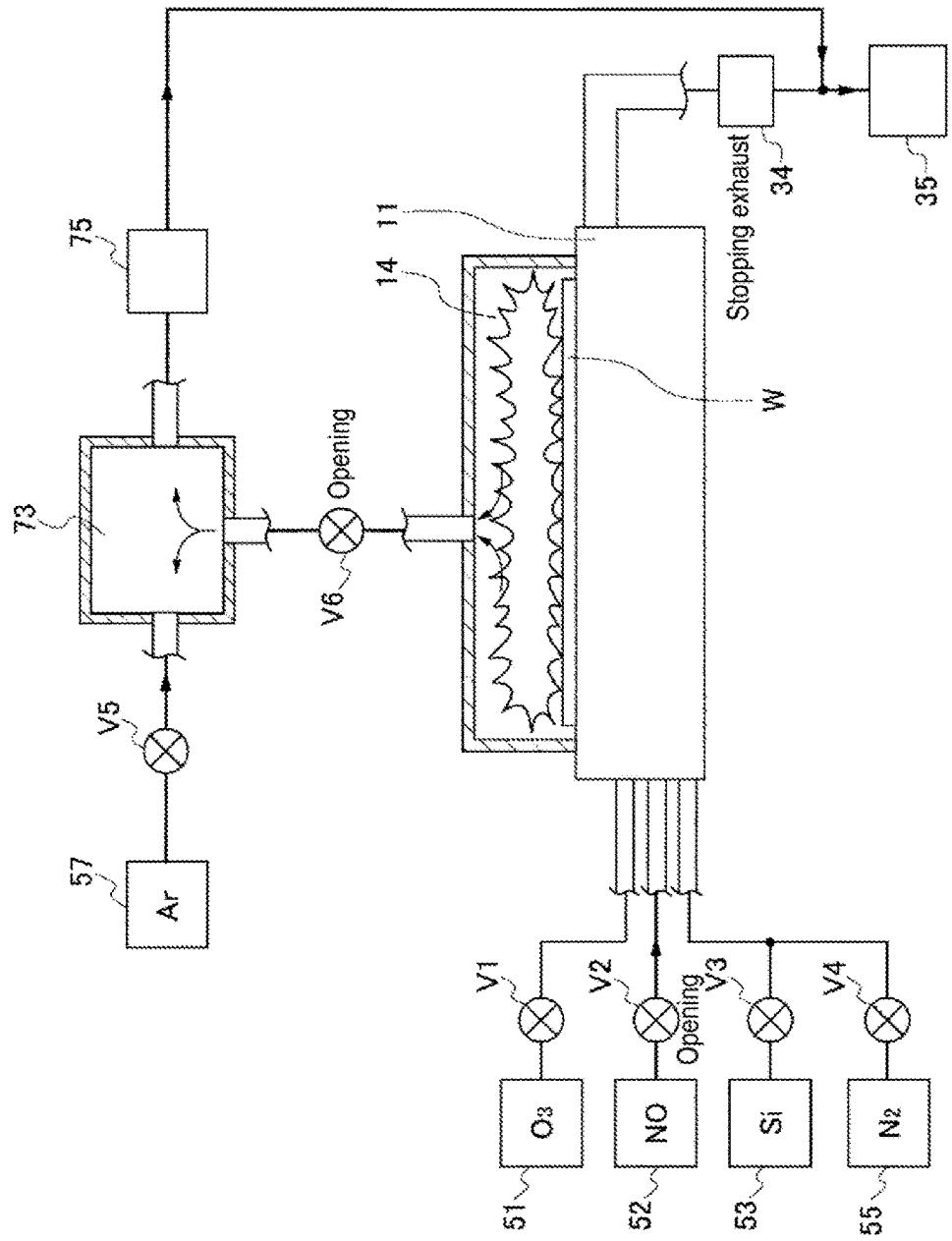
FIG. 17 is a process diagram illustrating the film formation process of the film formation apparatus.

Thereafter, similar to Step S2 of the first embodiment, the supply of the $N_2$ gas and the exhaust of the processing space 14 are performed, the BTBAS gas within the processing space 14 is purged (Step S12). Next, similar to Step S3 of the first embodiment, after the $O_3$ gas is supplied to the processing space 14, the exhaust of the processing space 14 is stopped, so the $O_3$ gas is sealed within the processing space 14. Accordingly, a pressure within the processing space 14 may become 50 Torr, for example, which is the same as the pressure within the buffer region 73 (FIG. 16, Step S13). Subsequently, the valve V6 is open, and thus the processing space 14 communicates with the buffer region 73 (Step S14). Since the pressure within the processing space 14 is the same as the pressure within the buffer region 73, a gas flow formed between the buffer region 73 and the processing space 14 is suppressed, similar to the first embodiment. Therefore, a concentration of the $O_3$ gas within the processing space 14 maintains a concentration at which the chain decomposition reaction can occur. Thereafter, similar to Step S5 of the first embodiment, the NO gas is supplied to the processing space 14, and thus the chain decomposition reaction of $O_3$ occurs (FIG. 17, Step S15). Since the processing space 14 communicates with the buffer region 73 as described above, reaction products of the processing space 14 may be diffused into the buffer region 73. Accordingly, a pressure rise within the processing space 14 is reduced.

Figure 18:
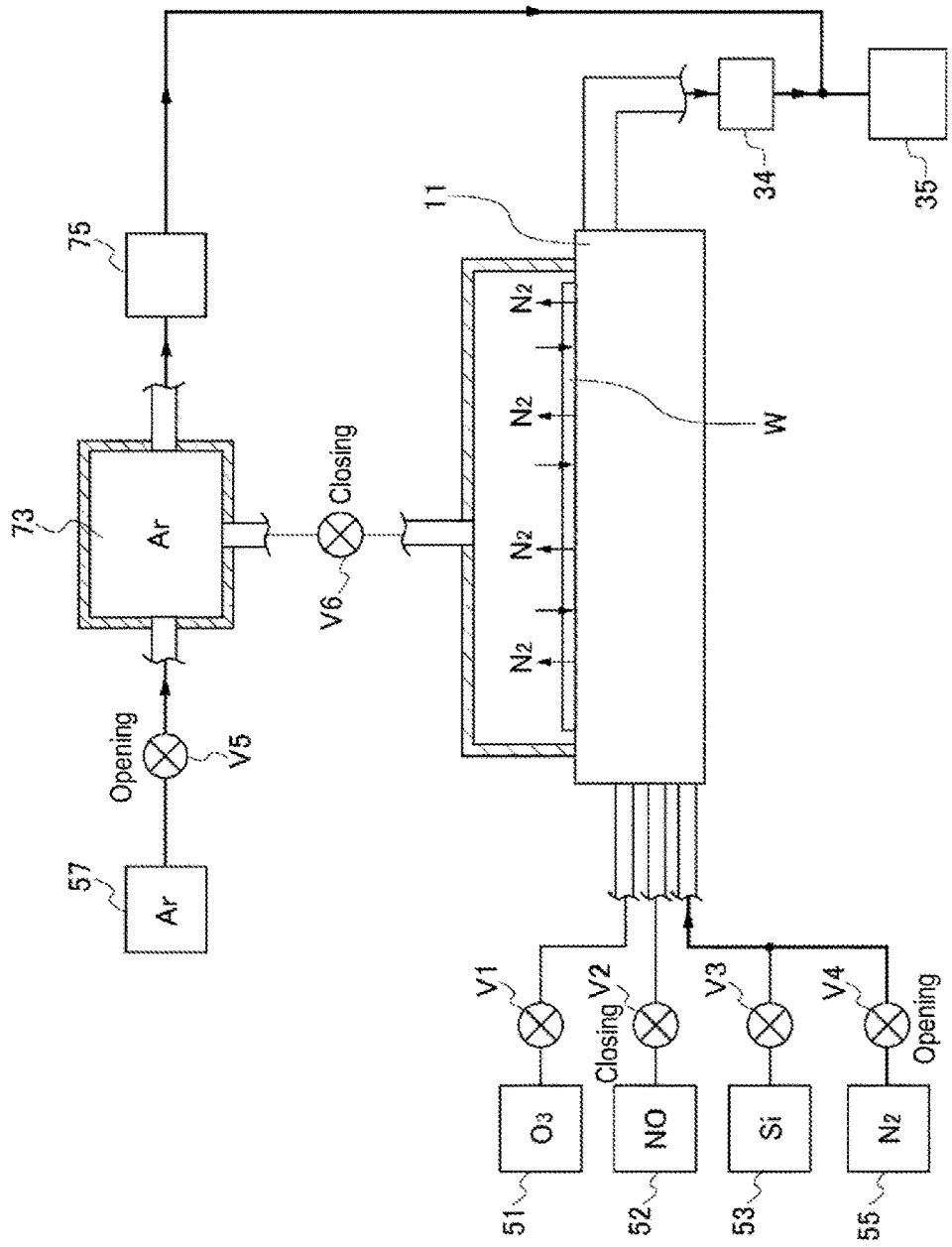
FIG. 18 is a process diagram illustrating the film formation process of the film formation apparatus.

Next, the valve V6 is closed. Similar to Step S12, an $N_2$ gas is supplied to the processing space 14 while the exhaust of the processing space 14 is performed, and thus the reaction products of the chain decomposition reaction remaining in the processing space 14 are purged. Furthermore, the reaction products remaining in the buffer region 73 are purged by the supply of the Ar gas and the exhaust of the buffer region 73 (FIG. 18, Step S16). A cycle including Steps S11 to S16 is repeated, so that a silicon oxide film is formed on the wafer W. The film formation apparatus 7 of the second embodiment has the same effects as the film formation apparatus 1 of the first embodiment because each reaction in Steps S11 to S16 is performed at room temperature similar to the film formation apparatus 1 of the first embodiment.

[Third Embodiment]

Figure 19:
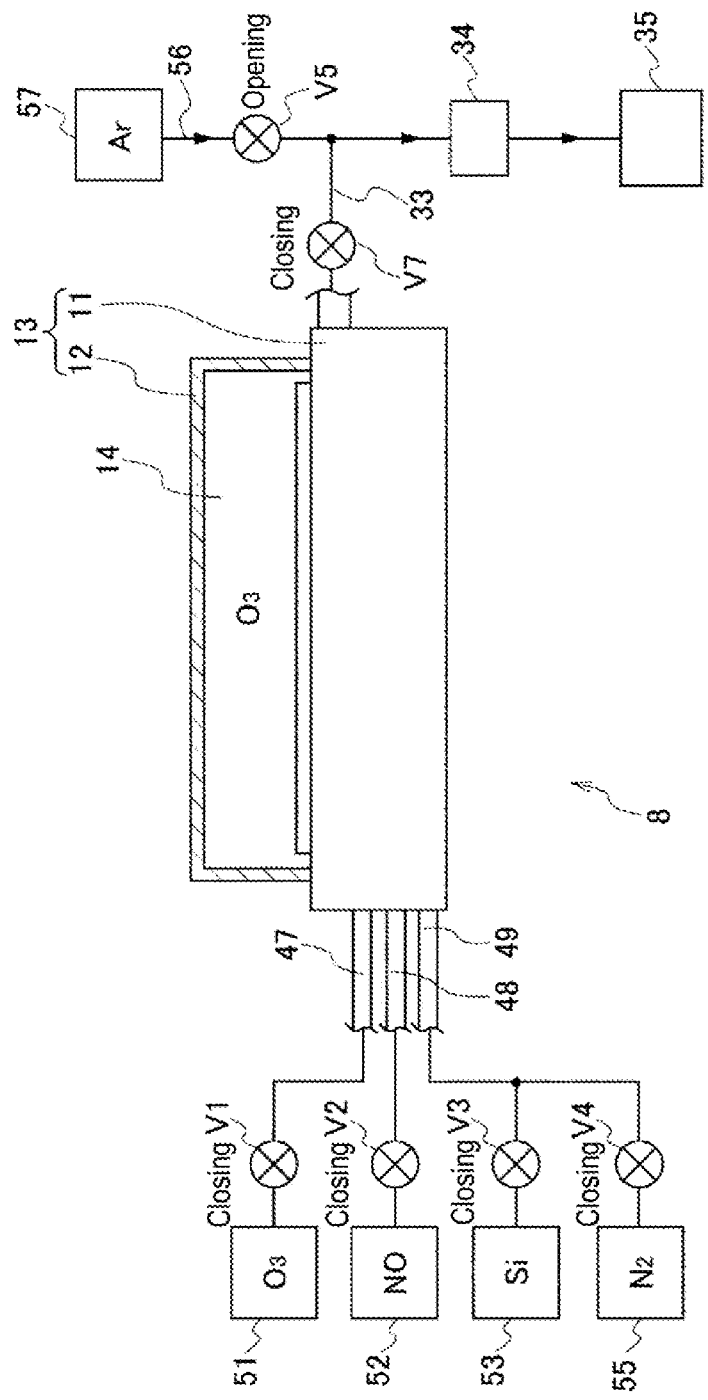
FIG. 19 is a process diagram illustrating a film formation process of a film formation apparatus in accordance with a third embodiment of the present disclosure.

A film formation apparatus 8 in accordance with a third embodiment of the present disclosure is described below with reference to FIG. 19 based on a difference between the film formation apparatus 8 and the film formation apparatus 1. Similar to the aforementioned film formation apparatus 7, the outer chamber 15 is not installed in the film formation apparatus 8. Furthermore, a valve V7 forming a partition unit is installed in the exhaust pipe 33 of the film formation apparatus 8 on an upstream side of the exhaust amount adjustment unit 34. Furthermore, a downstream end of the gas supply pipe 56 connected to an upstream end of the Ar gas supply source 57 is connected between the valve V7 installed in the exhaust pipe 33 and the exhaust amount adjustment unit 34.

An operation of the film formation apparatus 8 is described below. After Step S11 (i.e., the adsorption of aminosilane on the wafer W) and Step S12 (i.e., the purge of the processing space 14) described in the second embodiment are performed, an ozone gas is supplied to and stored in the processing space 14 simultaneously with the exhaust of the processing space 14. Thereafter, the exhaust of the processing space 14 is stopped, and the $O_3$ gas is sealed within the processing space 14. The exhaust of the processing space 14 is stopped by closing the valve V7 in the exhaust pipe 33, instead of controlling the exhaust amount adjustment unit 34 (Step S23). Thereafter, the exhaust of the exhaust pipe 33 by the exhaust amount adjustment unit 34 is continuously performed. For example, the valve V5 may be open simultaneously with the closing of the valve V7, and the Ar gas may be supplied from the Ar gas supply source 57 to the exhaust pipe 33 through the gas supply pipe 56. Accordingly, a pressure within the exhaust pipe 33 may become 50 Torr, for example, which is the same as the pressure within the processing space 14 within which the $O_3$ gas is sealed (Step S24). FIG. 19 illustrates the state in which Step S24 is performed.

Figure 20:
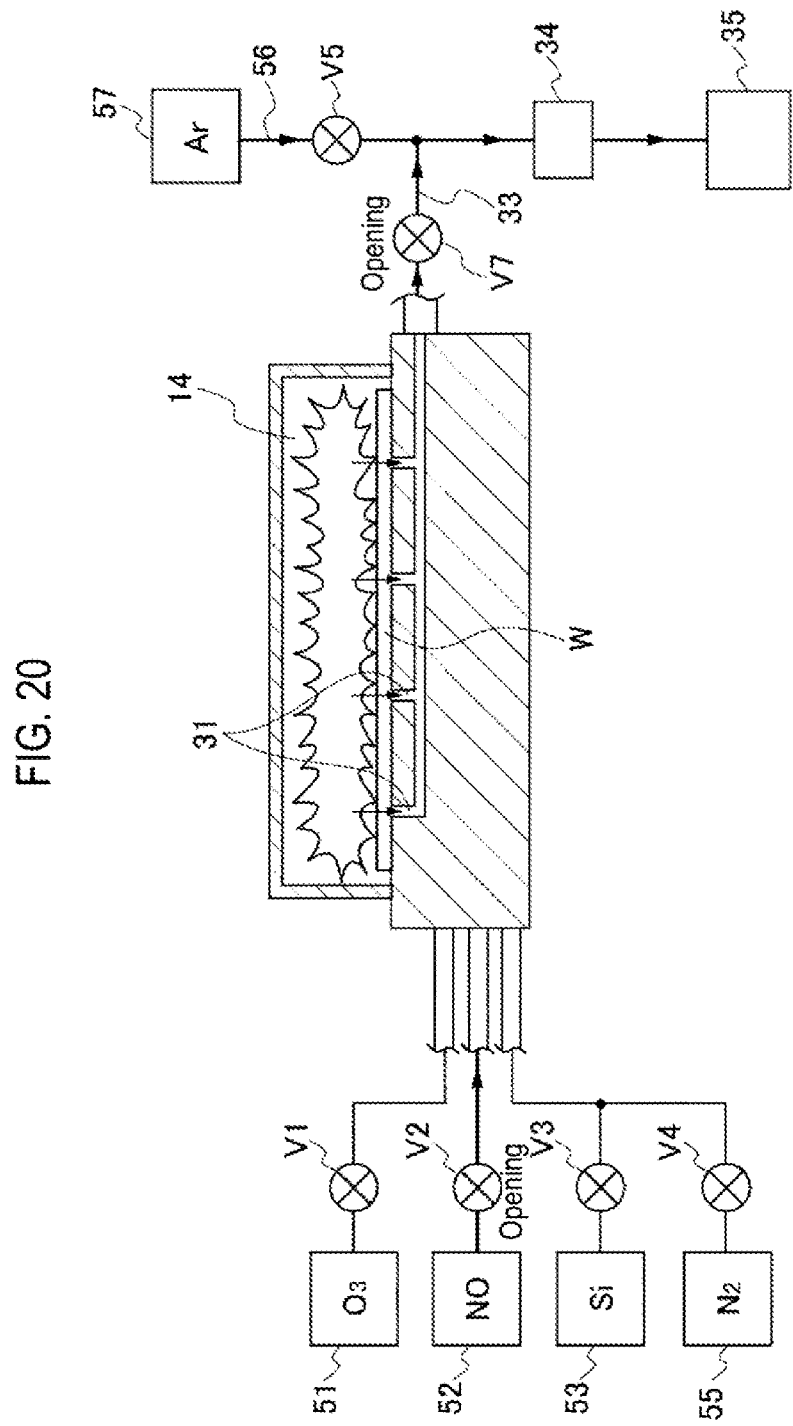
FIG. 20 is a process diagram illustrating the film formation process of the film formation apparatus.

Thereafter, the valve V7 is open. Since the Ar gas is supplied to the exhaust pipe 33 as described above, the introduction of the $O_3$ gas from the processing space 14 to the exhaust pipe 33 is suppressed. Accordingly, a concentration of the $O_3$ gas within the processing space 14 maintains a concentration at which the chain decomposition reaction can occur. Thereafter, similar Step S15 of the second embodiment, the NO gas is supplied to the processing space 14, and thus the chain decomposition reaction of $O_3$ occurs (FIG. 20, Step S25). At this time, since the valve V7 is open, reaction products of the processing space 14 may flow into the exhaust pipe 33. That is, in the third embodiment, the exhaust pipe 33 also functions as the buffer region 16 in the first embodiment.

Figure 21:
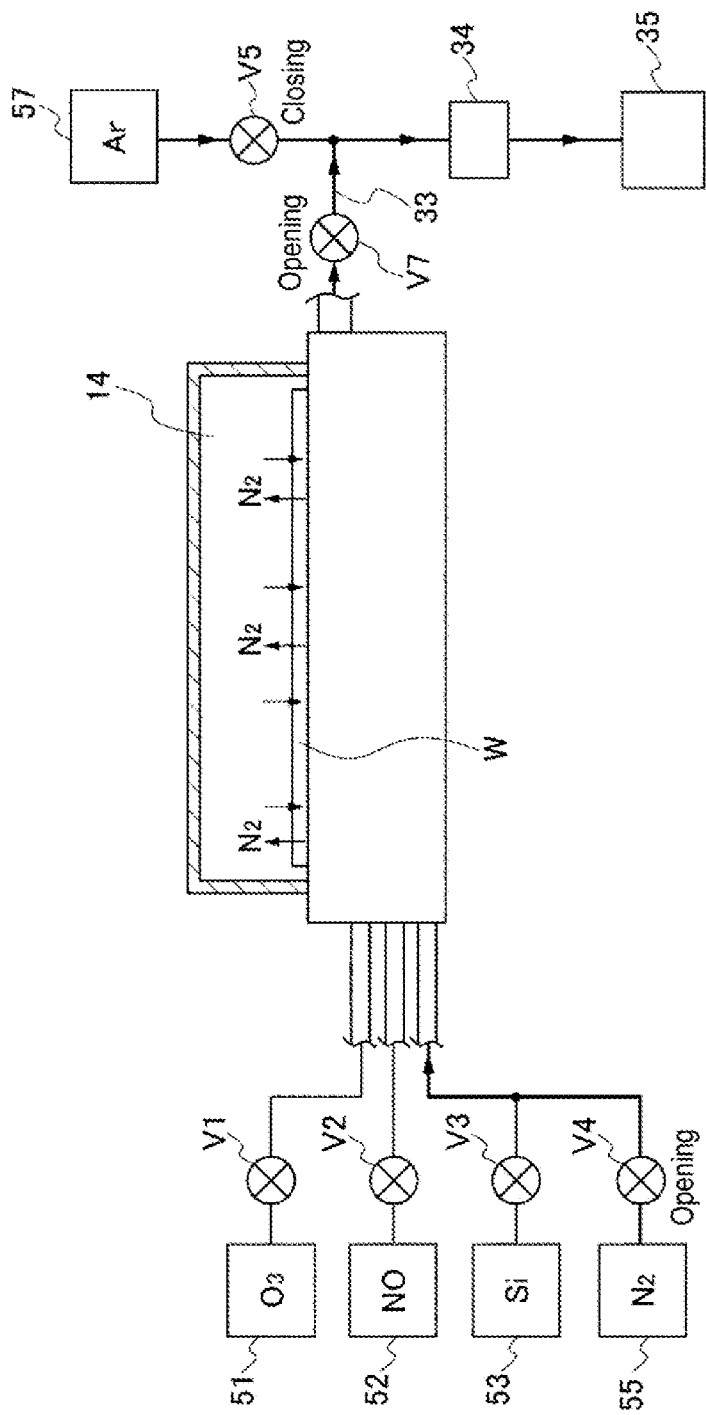
FIG. 21 is a process diagram illustrating the film formation process of the film formation apparatus.

Next, the valve V5 is closed, and the supply of the Ar gas to the exhaust pipe 33 is stopped. Furthermore, similar to Step S16 of the second embodiment, the $N_2$ gas is supplied to the processing space 14, so that the reaction products remaining in the processing space 14 and the exhaust pipe 33 are purged (FIG. 21, Step S26). In the film formation apparatus 8 of the third embodiment, a cycle including Steps S11, S12, and S23 to S26 is repeated, so that a silicon oxide film is formed on the wafer W. The film formation apparatus 8 has the same effects as the film formation apparatuses 1 and 7.

In each of the aforementioned embodiments, the aforementioned chain decomposition reaction has been illustrated as being started by supplying energy to ozone through a chemical reaction between NO and ozone. If the chain decomposition reaction is started by supplying energy, the present disclosure is not limited to the chemical reaction between NO and ozone. For example, a laser beam radiation unit for radiating a laser beam to the processing space 14 may be installed in the hood 12 or the stage 11. Furthermore, the chain decomposition reaction may be started by applying energy to ozone through the radiation of the laser beam. Furthermore, an electrode may be installed in the hood 12 or the stage 11, and a discharge may occur by applying a voltage to the electrode. The chain decomposition reaction may be started by applying energy generated from the discharge. In this case, from a viewpoint of simplifying the configuration of the film formation apparatus and of preventing metal forming the electrode for the discharge from being scattered to the wafer W, the chain decomposition reaction may occur by generating the aforementioned chemical reaction. A gas for applying energy is not limited to the NO gas, but any gas capable of generating the aforementioned chain decomposition reaction may be used.

However, for example, in the film formation apparatus 1, an ammonia gas, a methane gas, or a diborane gas, together with the ozone gas, may be supplied to the processing space 14. In such a state, the NO gas may be supplied to the processing space 14. The gases are also decomposed and chemically react with aminosilane when $O_3$ is decomposed. Thus, a silicon oxide film doped with elements that form the gases can be formed. Specifically, a silicon oxide film doped with nitrogen (N), carbon (C), or boron (B) can be formed by supplying the ammonia gas, the methane gas, or the diborane gas to the processing space 14. If such doping is performed in each embodiment, each doping gas is supplied to the processing space 14 until the NO gas is supplied to the processing space 14 after the processing space 14 is purged in the step right before aminosilane is adsorbed. When each doping gas is supplied, each of the aforementioned gas supply paths 44 to 46 of the stage 11 may be used.

The source gas applied to the embodiments is not limited to the formation of the silicon oxide film as described above. For example, an aluminum oxide film, a hafnium oxide film, a strontium oxide film, or a titanium oxide film may be formed using trimethylaluminum [TMA], tetrakis(ethylmethyl)aminohafnium [TEMHF], strontium bis(tetramethylheptanedionate) [Sr(THD)$_2$], or titanium methylpentanedionato bis(tetramethylheptanedionate) [Ti(MPD)(THD)].

<Evaluation Test>

An evaluation test performed in relation to the embodiments of the present disclosure is described below. For an evaluation test 1, as described in each embodiment, the silicon oxide film was formed on the wafer W by sequentially supplying the gases to the vacuum chamber 13 at room temperature. An apparatus used in the evaluation test 1 is configured approximately similar to the film formation apparatus 1 except that it is not equipped with the outer chamber 15, and the processing space 14 does not communicate with the buffer region 16 when the NO gas is supplied. The silicon oxide film formed using the apparatus was subject to wet etching, and an etching rate was measured. In the evaluation test 1, an etching rate on one end side of the wafer W and an etching rate on the other end side of the wafer W were measured, respectively.

For a comparison test 1-1, a silicon oxide film was formed on the wafer W using a film formation apparatus capable of generating plasma of an oxygen gas in a vacuum chamber (processing chamber). More specifically, the film formation apparatus supplies a source gas for forming a film to the vacuum chamber 13 similar to the film formation apparatus 1 and also generate plasma of oxygen supplied to the vacuum chamber 13. Furthermore, the film may be formed by alternately performing the supply of the source gas for forming a film and the oxidization of the source gas through the plasma. Similar to the evaluation test 1, in the comparison test 1-1, the oxidation was performed at room temperature. After the film was formed, the silicon oxide film was subject to wet etching and an etching rate was measured, similar to the evaluation test 1.

For a comparison test 1-2, while the wafer W within the vacuum chamber is heated to a specific temperature using a heater, a silicon oxide film was formed on the wafer W by alternately repeatedly supplying a source gas for forming a film and ozone to the wafer W. That is, in the comparison test 1-2, the chain decomposition reaction of ozone was not performed, and thermal energy was applied to the wafer W by heating the wafer W, so that aminosilane adsorbed on the wafer W was oxidized by ozone. After the film was formed, an etching rate was measured similar to other tests.

Figure 22:
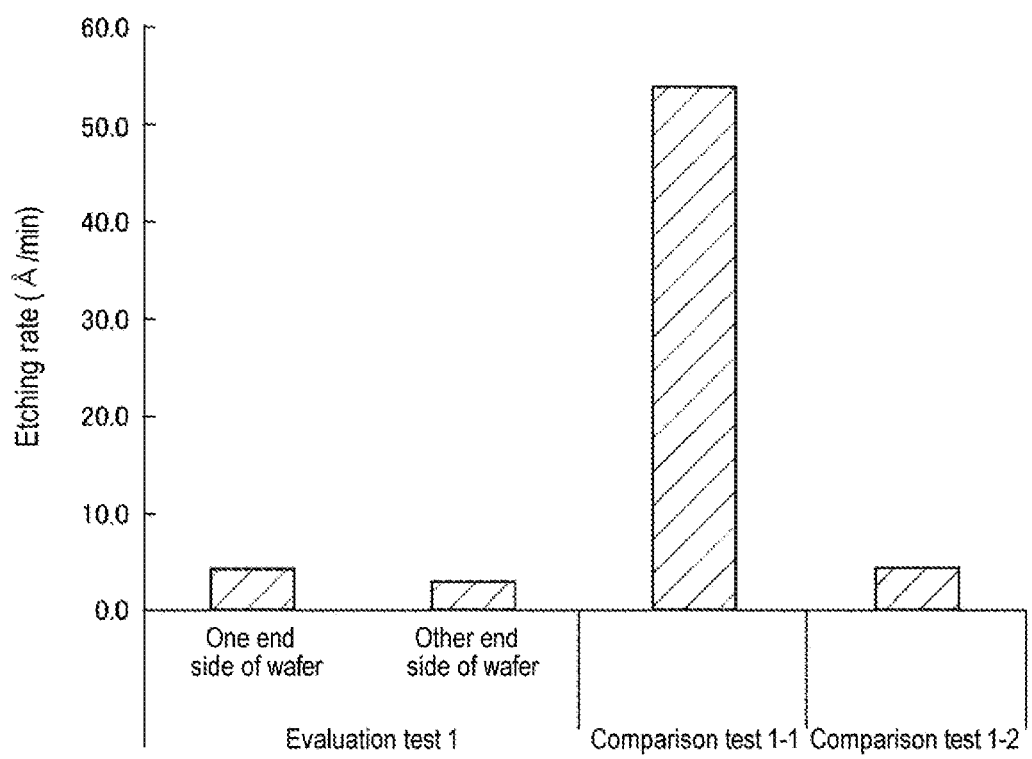
FIG. 22 is a graph illustrating the results of an evaluation test.

FIG. 22 is a graph illustrating the measured results of the etching rates of the evaluation test 1 and the comparison tests. In FIG. 22, a vertical axis indicates an etching rate (unit: Å/min) As illustrated in the graph, in the evaluation test 1, an etching rate on one end side of the wafer W is 4.8 Å/min and an etching rate on the other end side of the wafer W is 3.4 Å/min, which are almost the same. Furthermore, an etching rate in the comparison test 1-1 is 54.2 Å/min, and an etching rate in the comparison test 1-2 is 4.7 Å/min. That is, the etching rates in the evaluation test 1 were suppressed to be clearly lower than that, in the comparison test 1-1 in which the processing was performed at the same room temperature and are almost the same as the etching rate in the comparison test 1-2 in which the heating was performed using the heater in order to oxidize. That is, it was found that, in the evaluation test 1, the silicon oxide film having almost the same film quality as the silicon oxide film formed by heating while the film was formed was formed. Accordingly, the results of the evaluation test revealed that the silicon oxide film having good film quality could be formed using the method in accordance with the embodiment of the present disclosure although the heating is not performed using a heater, as described in the embodiments.

Next, an evaluation test 2 performed to examine the heat history of the silicon oxide film formed by performing processing according to the aforementioned embodiment is described below. In the evaluation test 2, phosphorus (P) was injected into a plurality of substrates made of silicon through ion implantation. The ion implantation was performed using 2 keV and 1E15 ions/cm$^2$. Furthermore, a silicon oxide film was formed on the substrates into which phosphorous (P) is injected using the film formation apparatus used in the evaluation test 1. In forming the silicon oxide film, the cycle was performed 100 times. Furthermore, in Step S3 of each cycle, an ozone gas was supplied to the vacuum chamber 13 so that a concentration of ozone within the vacuum chamber 13 became 77.7 Vol. %. Furthermore, after the silicon oxide film was formed, a resistance value of the silicon oxide film was measured. Furthermore, heating processing was performed on substrates that belong to the substrates into which phosphorous (P) was injected and on which the silicon oxide film was not formed at different temperatures for 5 minutes as references. After the heating process, the resistance values of the references were measured.

Figure 23:
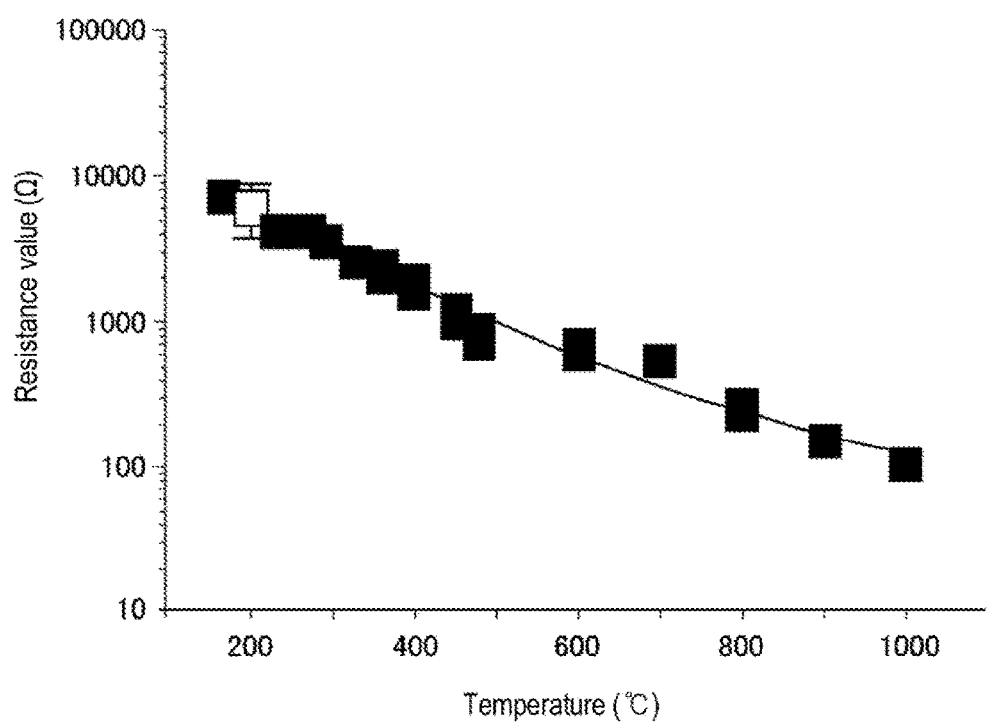
FIG. 23 is a graph illustrating the results of the evaluation test.

FIG. 23 is a graph illustrating the results of the evaluation test 2. Black plots are the resistance values of the references, while a white plot is the resistance value of the silicon oxide film formed using the film formation apparatus 1. As illustrated in the graph, the resistance value of the silicon oxide film corresponds to the resistance values of the references heated at 200 degrees C. That is, performing 100 cycles described in the embodiment corresponds to heating the substrate at 200 degrees C. for 5 minutes. That is, it is supposed that, as described in the embodiment, aminosilane can be oxidized without heating the substrate using the aforementioned heater because the substrate is heated through the aforementioned chain decomposition reaction.

In accordance with the embodiments of the present disclosure, the ozone atmosphere capable of generating the forced chain decomposition reaction (chain decomposition reaction) within the vacuum chamber is formed, and the source adsorbed on the substrate is oxidized using the activated species of oxygen generated by the chain decomposition reaction. Relatively great energy is applied to the surface of the substrate for a very short time through the chain decomposition reaction, such that the activated species react with the source. Accordingly, the oxide film having good properties can be obtained because the oxidation is sufficiently performed although the substrate is not heated using a heating unit, such as a heater. Furthermore, an excessive rise of a pressure within the vacuum chamber can be suppressed because the vacuum chamber communicates with the buffer region to which the inert gas is supplied when the chain decomposition reaction occurs. As a result, the damage or deterioration of the substrate and the vacuum chamber can be suppressed.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film formation apparatus of forming a thin film by stacking a molecular layer of an oxide on a surface of a substrate in a vacuum atmosphere, the film formation apparatus comprising:
a vacuum chamber that includes a stage having a surface on which the substrate is loaded, a partition member configured to cover the entire substrate loaded on the surface of the stage, and a processing space between the surface of the stage and the partition member;
an outer chamber surrounding an outside of the vacuum chamber and having an internal space as a buffer region;
a source gas supply part having a source gas supply pipe in communication with the processing space to supply a source gas containing a source from a source gas supply source to the processing space via the source gas supply pipe;
an atmosphere gas supply part having an atmosphere gas supply pipe in communication with the processing space to supply an atmosphere gas from an atmosphere supply source to the processing space via the atmosphere gas supply pipe;
a reaction gas supply part having a reaction gas supply pipe in communication with the processing space to supply a reaction gas from a reaction gas supply source to the processing space via the reaction gas supply pipe;
an inert gas supply part having an inert gas supply pipe in communication with the buffer region to supply an inert gas from an inert gas supply source to the buffer region via the inert gas supply pipe;
a partition lifting mechanism that moves the partition member downward to a first position in which the partition member is in close contact with the surface of the stage and the buffer region is partitioned with respect to the processing space by the partition member, or moves the partition member upward to a second position in which a gap is formed between the partition member and the surface of the stage and the buffer region is in communication with the processing space through the gap; and
a control part configured to output a control signal for repeatedly performing a cycle plural times, the cycle including:
moving the partition member downward to the first position by the partition lifting mechanism;
supplying the inert gas to the buffer region by the inert gas supply part in a state where the partition member is kept in the first position, so as to set a pressure in the buffer region to be a predetermined pressure;
supplying the source gas to the processing space by the source gas supply part in a state where the partition member is kept in the first position, so as to adsorb the source on the surface of the substrate in the processing space;
supplying the atmosphere gas to the processing space by the atmosphere gas supply part in a state where the partition member is kept in the first position, so as to form an ozone atmosphere containing an ozone having a concentration equal to or higher than a concentration at which a chain decomposition reaction occurs in the processing space, and so as to set a pressure in the processing space to be the predetermined pressure;
moving the partition member upward to the second position by the partition lifting mechanism in a state where both of the pressure in the buffer region and the pressure in the processing space are equal to the predetermined pressure; and
supplying the reaction gas to the processing space by the reaction gas supply part in a state where the partition member is kept in the second position, so as to generate activated species of an oxygen in the processing space through a forced decomposition of the ozone by a chemical reaction between the reaction gas and the ozone, and so as to obtain the oxide by oxidizing, in the processing space, the source adsorbed on the surface of the substrate through the activated species.

2. The film formation apparatus of claim 1, wherein the control part is further configured to move, by the partition lifting mechanism, the partition member upward to the second position between the act of supplying the atmosphere gas and the act of supplying the reaction gas in the same cycle.

3. The film formation apparatus of claim 1,
wherein the partition lifting mechanism comprises an opening and closing unit that opens and closes the vacuum chamber.

4. The film formation apparatus of claim 3, wherein the partition member is a hood covering the stage, and
wherein the opening and closing unit comprises a lifting unit that moves the hood up and down with respect to the stage.

5. The film formation apparatus of claim 1, wherein the reaction gas comprises a nitrogen monoxide.

* * * * *